US012684958B2

(12) United States Patent  
Fukuda

(10) Patent No.: US 12,684,958 B2  
(45) Date of Patent: Jul. 14, 2026

(54) DISPLAY DEVICE AND MANUFACTURING METHOD OF THE SAME

(71) Applicant: Magnolia White Corporation, Tokyo (JP)

(72) Inventor: Kaichi Fukuda, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 467 days.

(21) Appl. No.: 18/481,325

(22) Filed: Oct. 5, 2023

(65) Prior Publication Data

US 2024/0121994 A1 Apr. 11, 2024

(30) Foreign Application Priority Data

Oct. 6, 2022 (JP) .................................. 2022-161682

(51) Int. Cl.  
*H10K 59/122* (2023.01)  
*H10K 59/12* (2023.01)  
*H10K 102/00* (2023.01)

(52) U.S. Cl.  
CPC ....... *H10K 59/122* (2023.02); *H10K 59/1201* (2023.02); *H10K 2102/351* (2023.02)

(58) Field of Classification Search  
CPC ............. H10K 59/122; H10K 59/1201; H10K 2102/351; H10K 50/813; H10K 50/844; H10K 50/822  
See application file for complete search history.

(56) References Cited

U.S. PATENT DOCUMENTS

| | | | |
|---|---|---|---|
| 2004/0160170 A1 | 8/2004 | Sato et al. | |
| 2009/0009069 A1 | 1/2009 | Takata | |
| 2019/0363275 A1 | 11/2019 | Ochi et al. | |
| 2021/0327981 A1* | 10/2021 | Lee ...................... | H10K 71/221 |
| 2022/0077251 A1 | 3/2022 | Choung et al. | |

FOREIGN PATENT DOCUMENTS

| | | |
|---|---|---|
| JP | 2000-195677 A | 7/2000 |
| JP | 2004-207217 A | 7/2004 |
| JP | 2008-135325 A | 6/2008 |
| JP | 2009-032673 A | 2/2009 |
| JP | 2010-118191 A | 5/2010 |
| WO | 2018/179308 A1 | 10/2018 |

* cited by examiner

*Primary Examiner* — Donald L Raleigh  
(74) *Attorney, Agent, or Firm* — XSENSUS LLP

(57) ABSTRACT

According to one embodiment, a display device comprises an insulating layer, a lower electrode on the insulating layer, a rib on the insulating layer, a partition including a lower portion and upper portion, an organic layer, an organic layer covering the lower electrode, and an upper electrode covering the organic layer. The rib comprises a first rib layer formed of an inorganic insulating material and arranged on the insulating layer, and a second rib layer formed of an inorganic insulating material and arranged on the first rib layer. The second rib layer protrudes from a side surface of the first rib layer and a side surface of the lower portion.

16 Claims, 17 Drawing Sheets

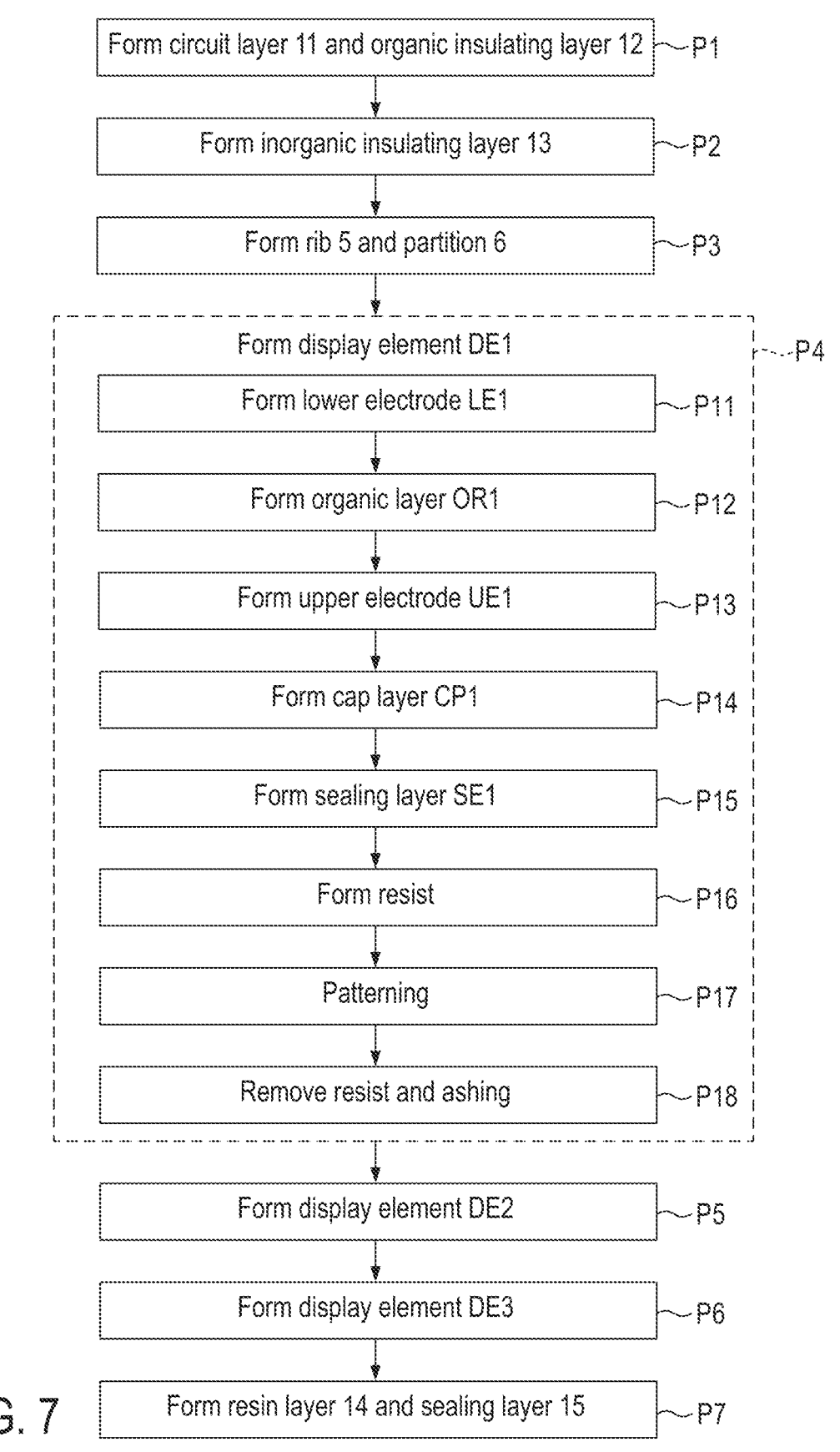
F I G. 7

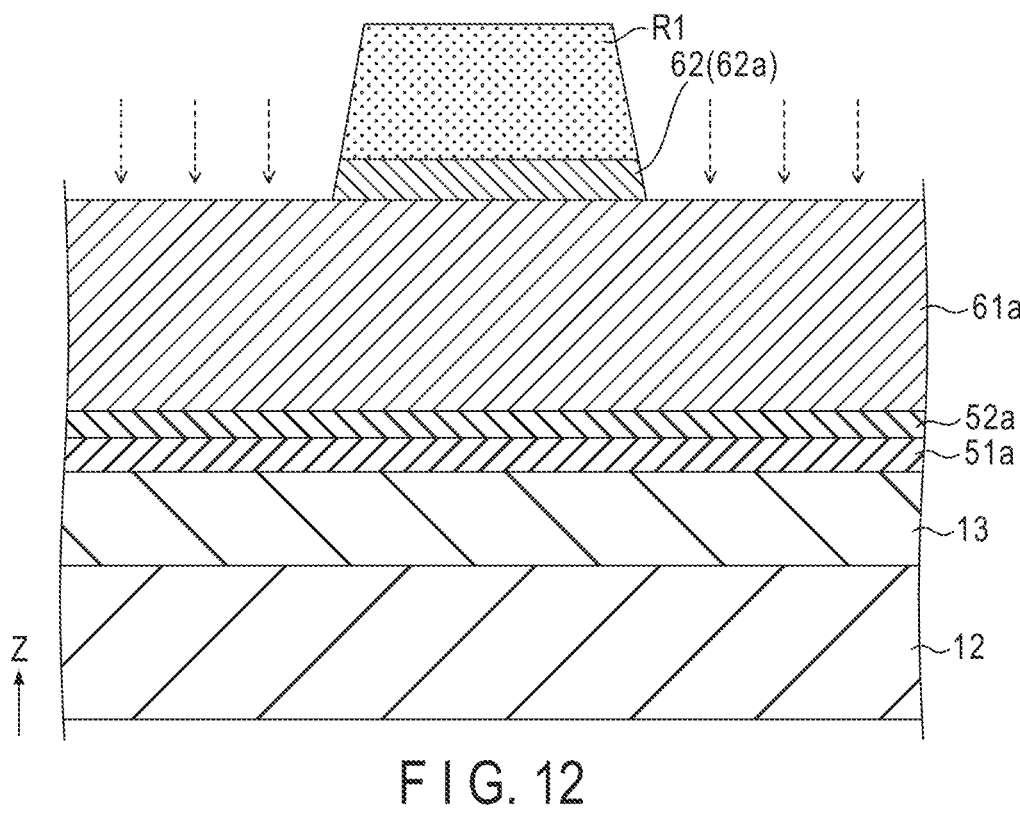
F I G. 12
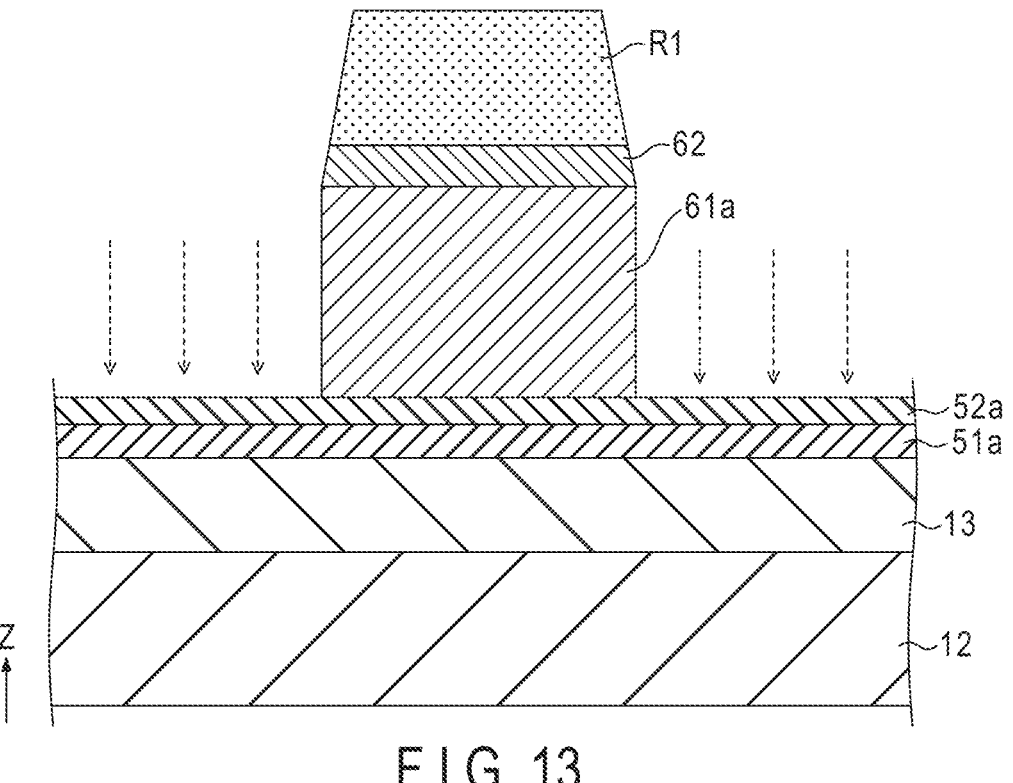
F I G. 13

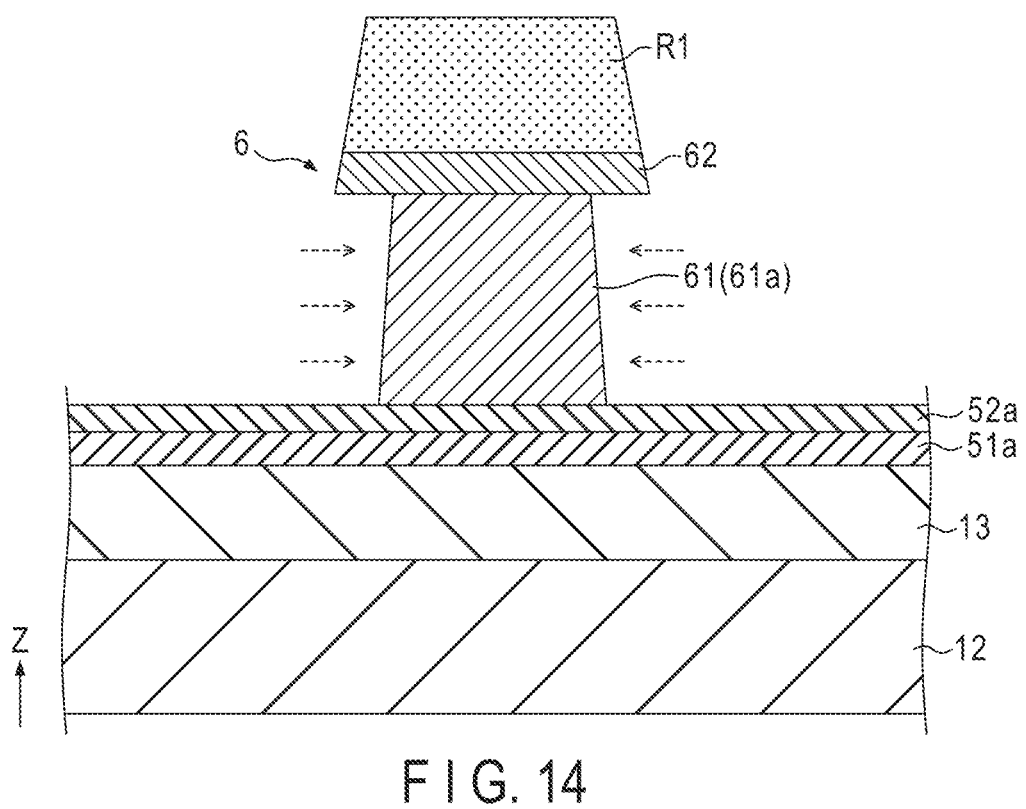
F I G. 14
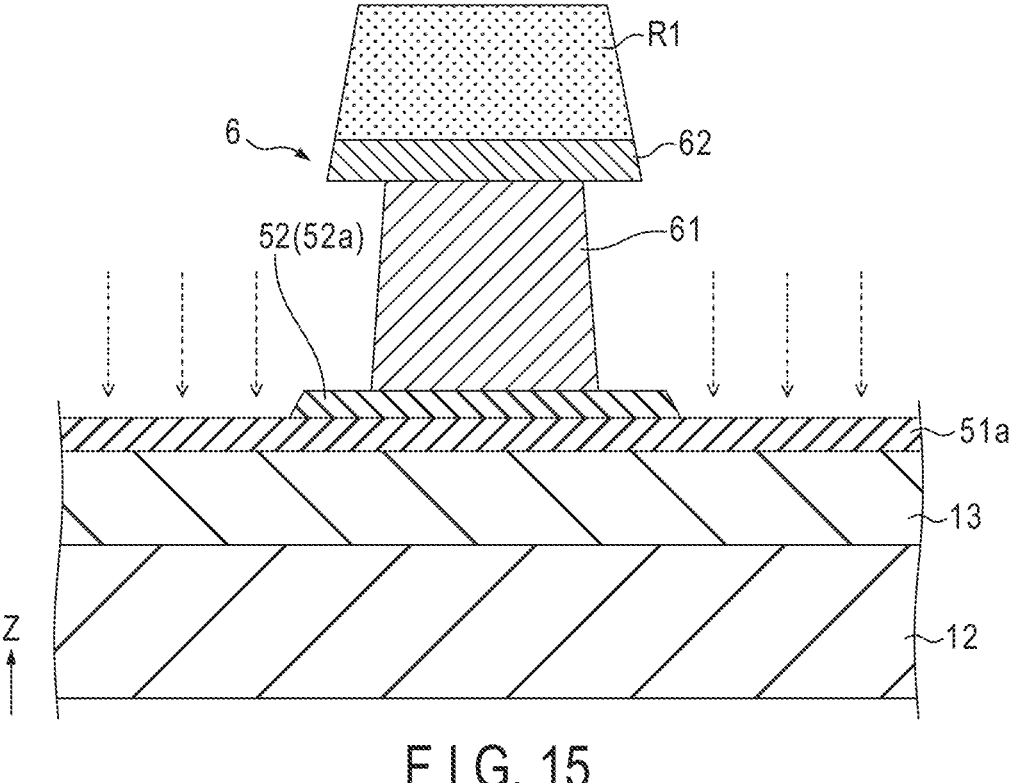
F I G. 15

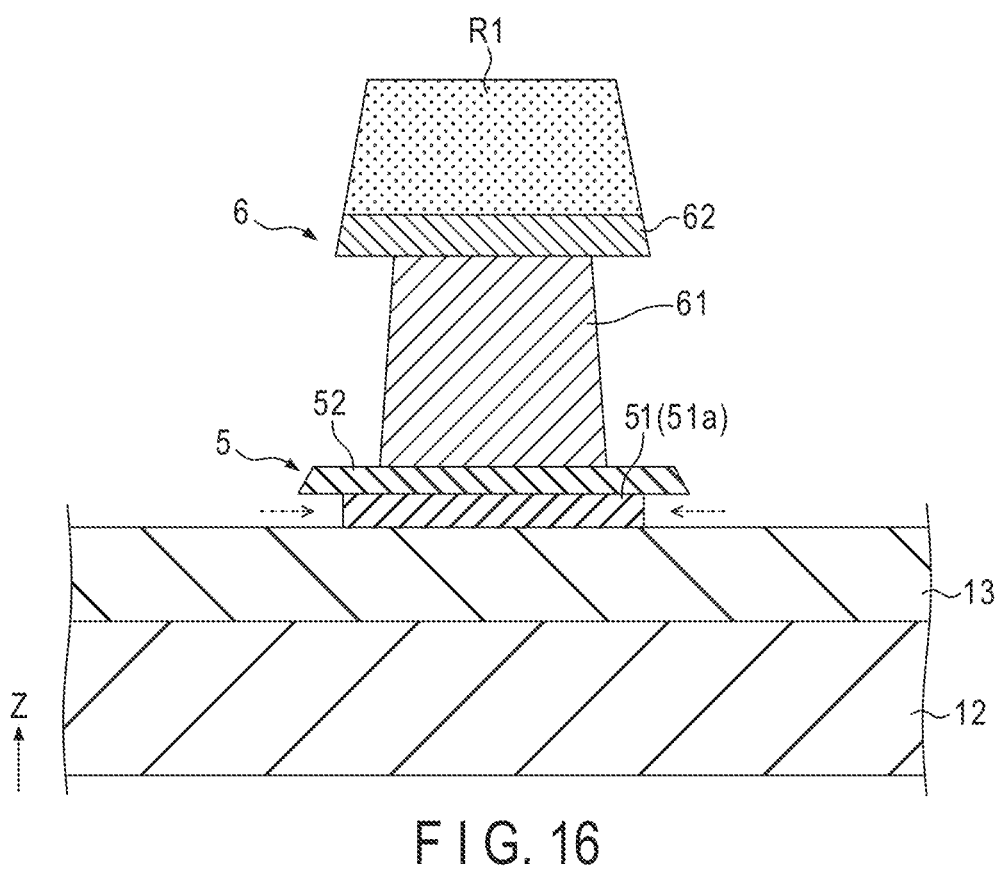
F I G. 16
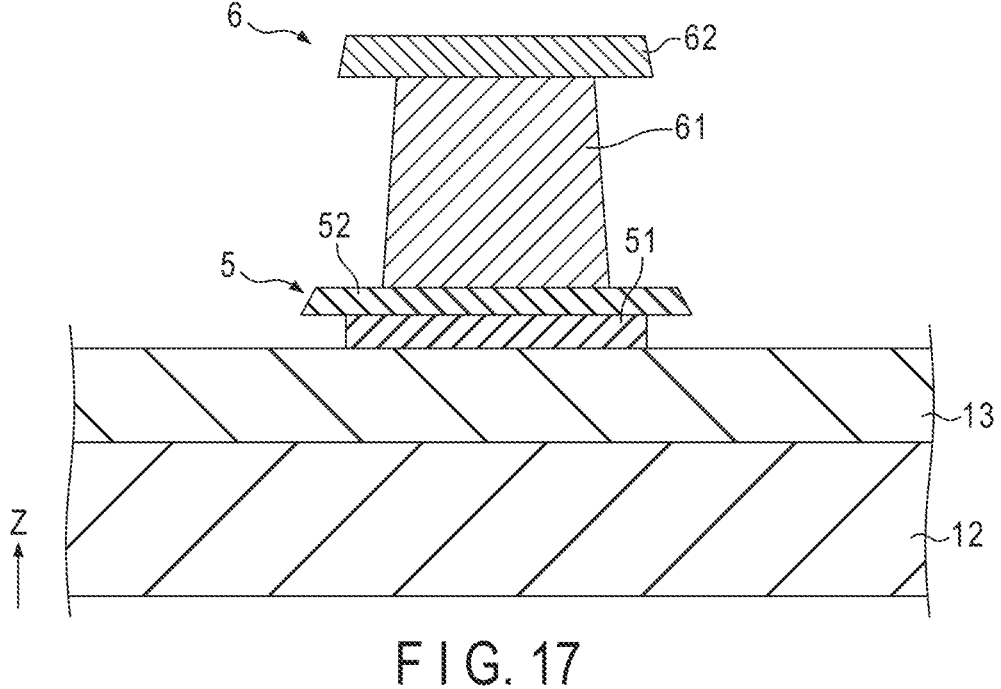
F I G. 17

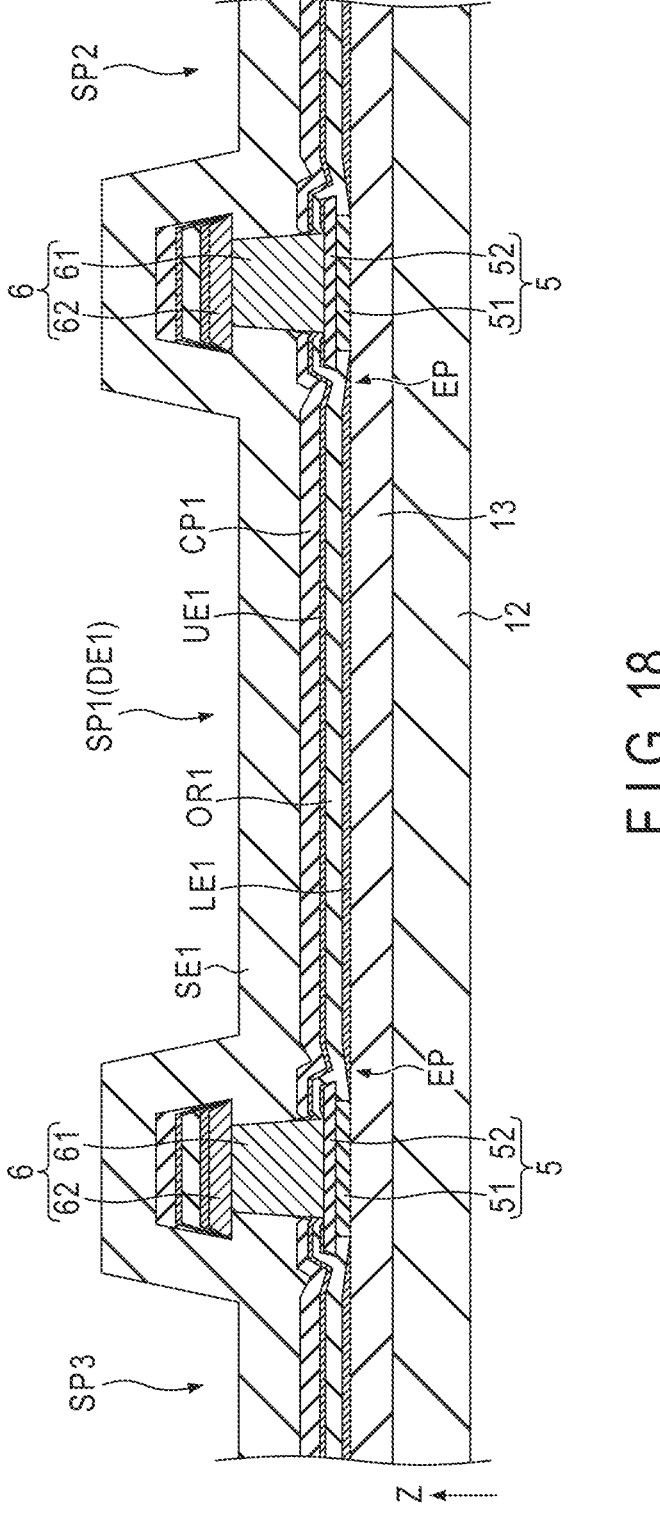
F I G. 18

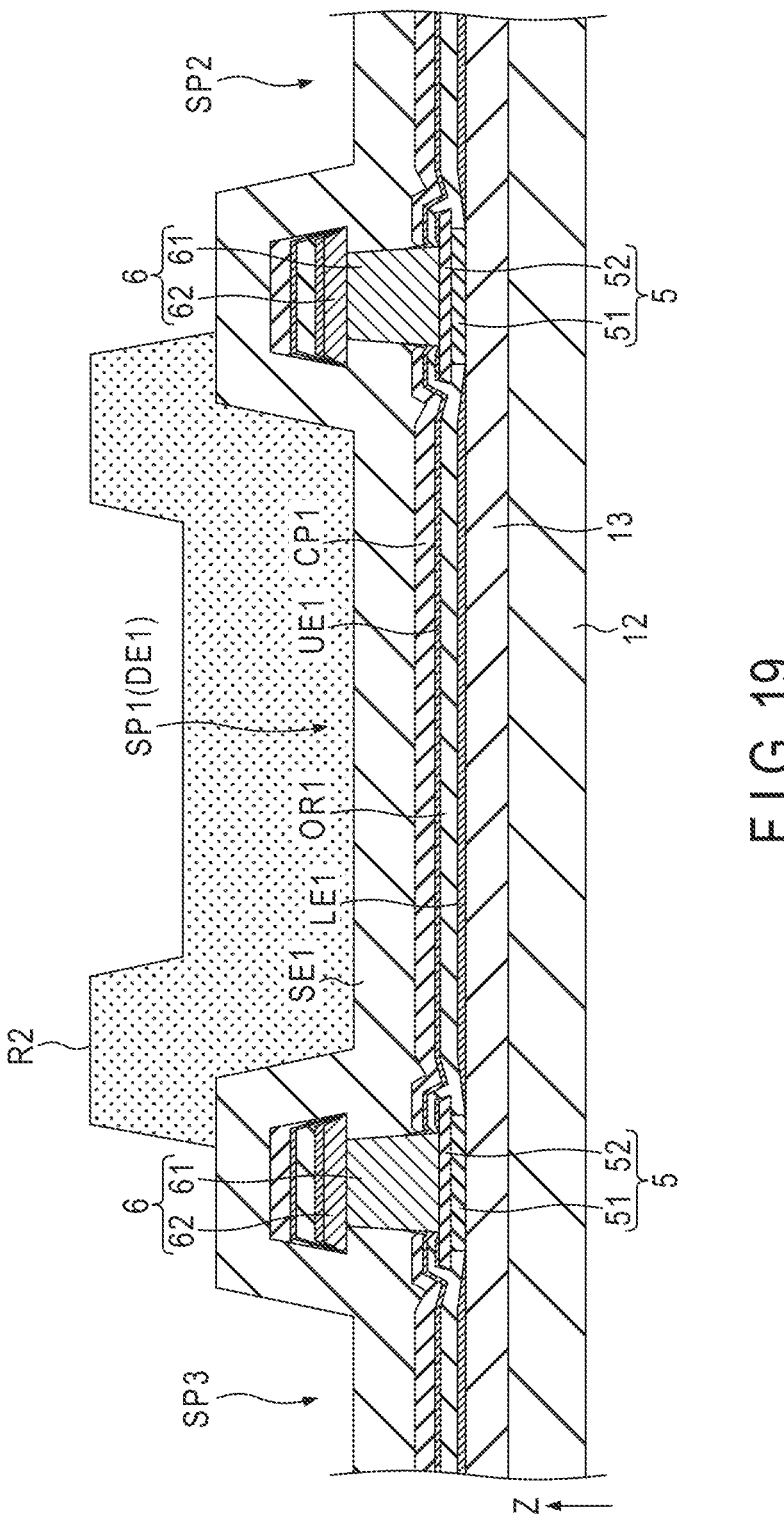
F I G. 19

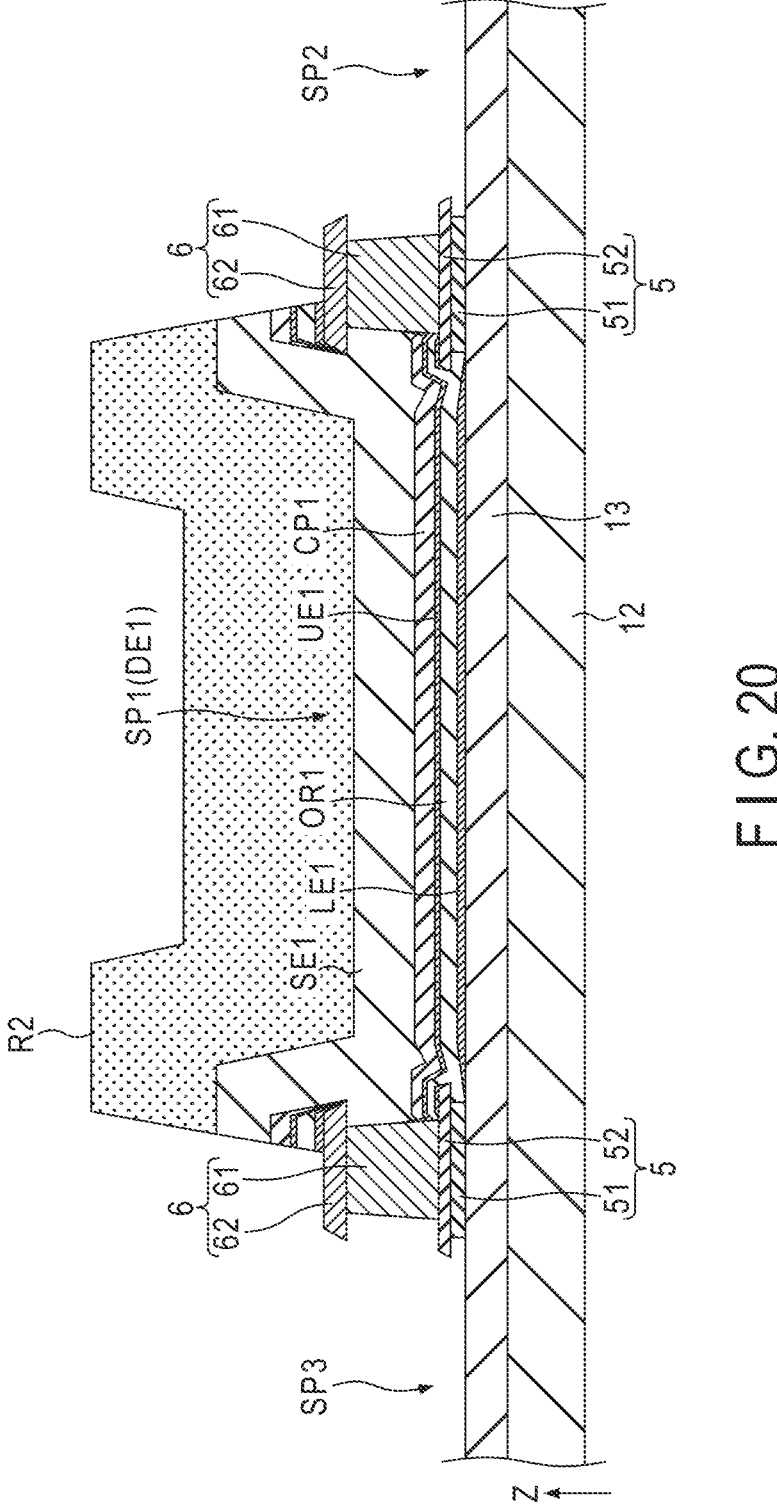
F I G. 20

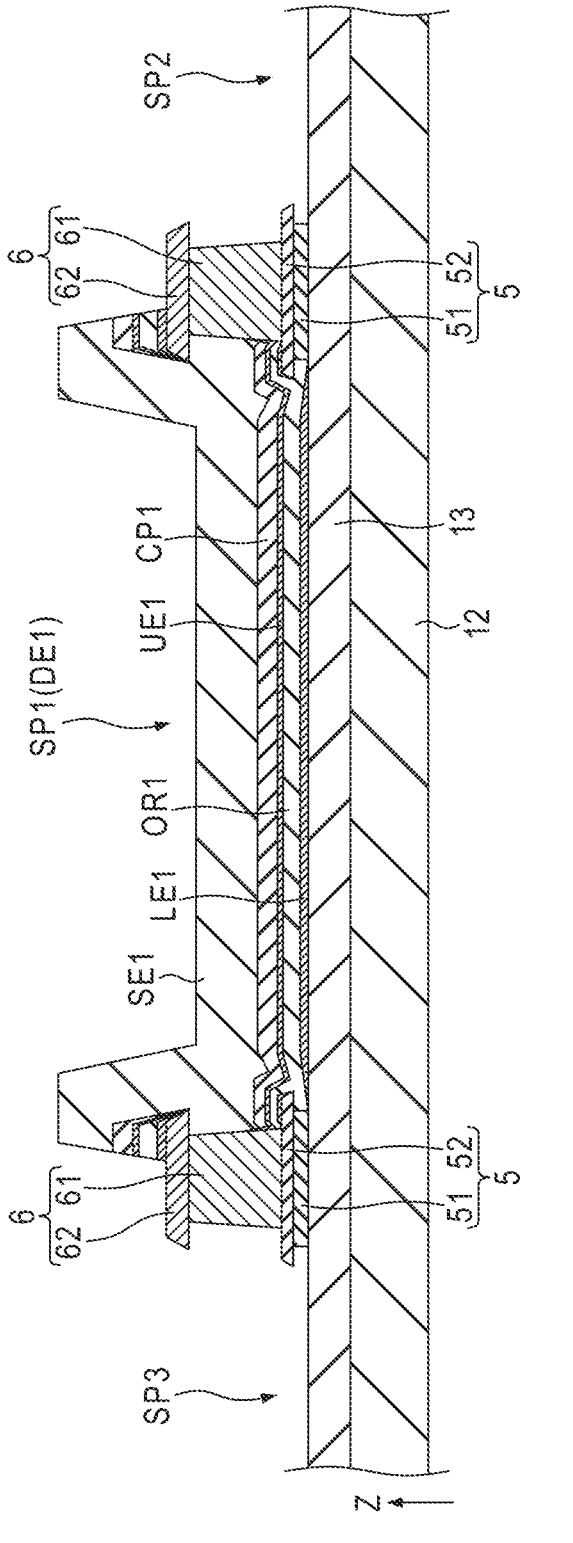
F I G. 21

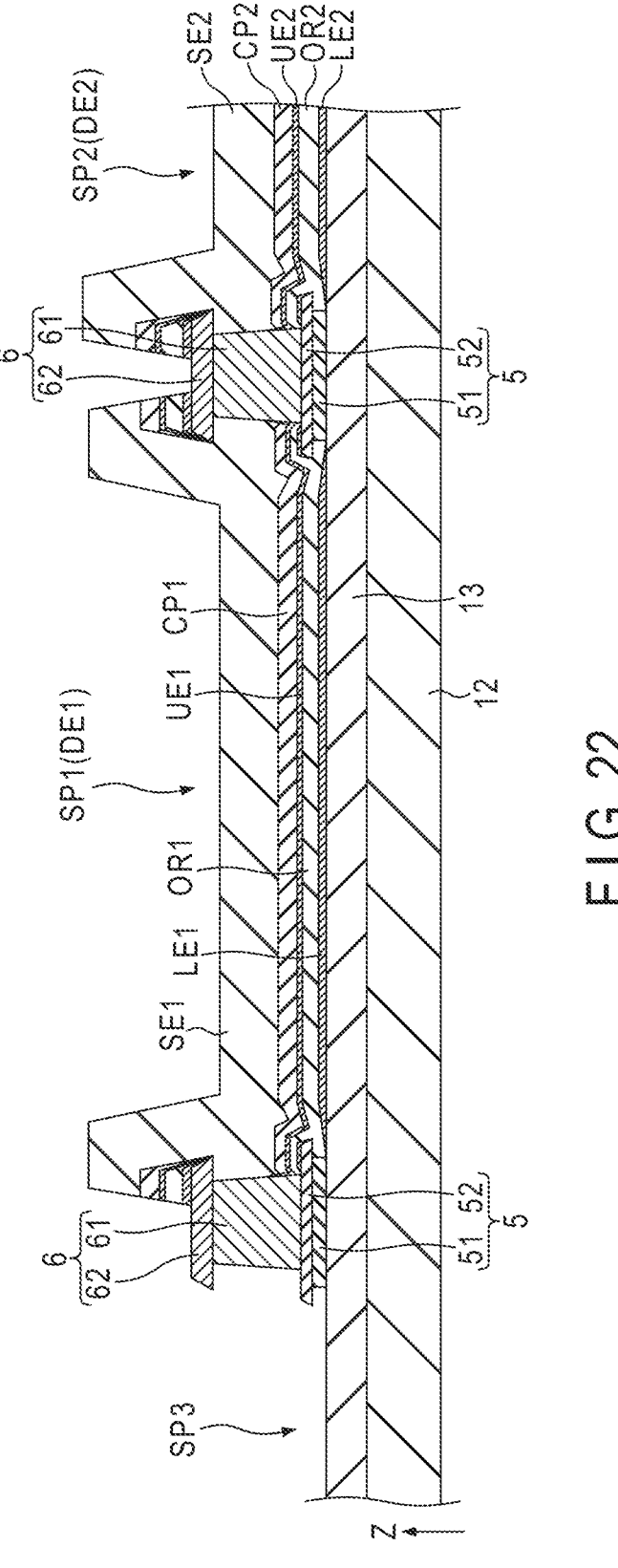
F I G. 22

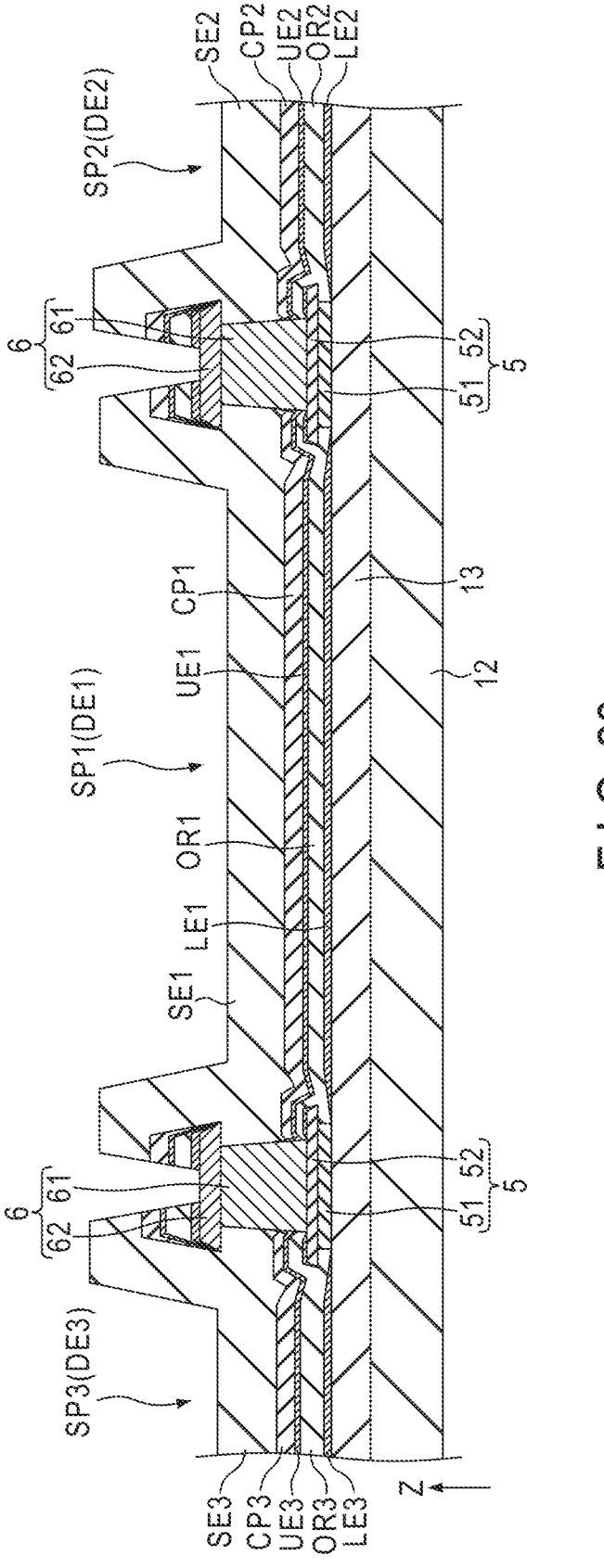
F I G. 23

DISPLAY DEVICE AND MANUFACTURING METHOD OF THE SAME

CROSS-REFERENCE TO RELATED APPLICATIONS

This application is based upon and claims the benefit of priority from Japanese Patent Application No. 2022-161682, filed Oct. 6, 2022, the entire contents of which are incorporated herein by reference.

FIELD

Embodiments described herein relate generally to a display device and a manufacturing method of the same.

BACKGROUND

Recently, display devices with organic light-emitting diodes (OLEDs) applied thereto as display elements have been put into practical use. This display device comprises a lower electrode, an organic layer covering the lower electrode, and an upper electrode covering the organic layer.

A technique for improving the light emission efficiency of the display elements is required for the above-described display device.

BRIEF DESCRIPTION OF THE DRAWINGS

FIG. 7 is a flowchart showing an example of a method of manufacturing the display device.

FIG. 12 is a schematic cross-sectional view showing a manufacturing process following FIG. 11.

FIG. 13 is a schematic cross-sectional view showing a manufacturing process following FIG. 12.

FIG. 14 is a schematic cross-sectional view showing a manufacturing process following FIG. 13.

FIG. 15 is a schematic cross-sectional view showing a manufacturing process following FIG. 14.

FIG. 16 is a schematic cross-sectional view showing a manufacturing process following FIG. 15.

FIG. 17 is a schematic cross-sectional view showing a manufacturing process following FIG. 16.

FIG. 18 is a schematic cross-sectional view showing a manufacturing process following FIG. 17.

FIG. 19 is a schematic cross-sectional view showing a manufacturing process following FIG. 18.

FIG. 20 is a schematic cross-sectional view showing a manufacturing process following FIG. 19.

FIG. 21 is a schematic cross-sectional view showing a manufacturing process following FIG. 20.

FIG. 22 is a schematic cross-sectional view showing a manufacturing process following FIG. 21.

FIG. 23 is a schematic cross-sectional view showing a manufacturing process following FIG. 22.

DETAILED DESCRIPTION

Figure 1:
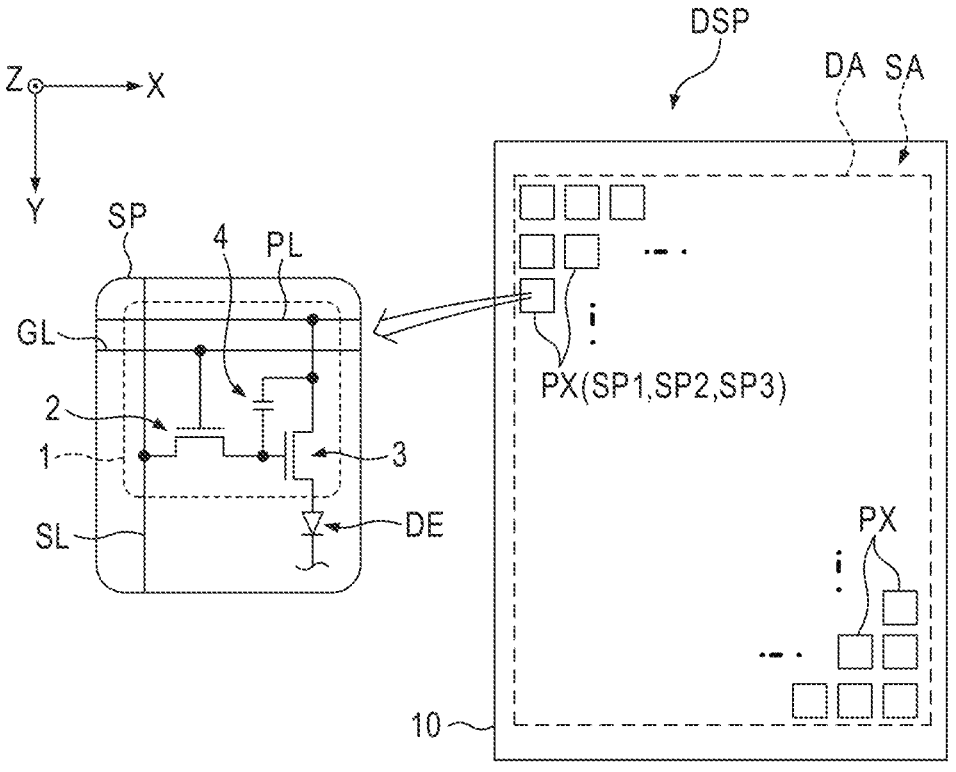
FIG. 1 is a view showing a configuration example of a display device according to one of embodiments.

In general, according to one embodiment, a display device comprises an insulating layer, a lower electrode, a rib, a partition, an organic layer, an organic layer, and an upper electrode. The insulating layer is formed of an inorganic insulating material. The lower electrode is arranged on the insulating layer. The rib is arranged on the insulating layer and surrounds the lower electrode. The partition includes a conductive lower portion arranged on the rib and an upper portion protruding from a side surface of the lower portion, and surrounds the lower electrode. The organic layer covers the lower electrode and emits light in response to application of a voltage. The upper electrode covers the organic layer and contacts the lower portion. The rib comprises a first rib layer formed of an inorganic insulating material and arranged on the insulating layer, and a second rib layer formed of an inorganic insulating material and arranged on the first rib layer. The second rib layer protrudes from a side surface of the first rib layer and a side surface of the lower portion.

According to another embodiment, a display device manufacturing method comprises forming an insulating layer of an inorganic insulating material, forming a first thin film of an inorganic insulating material on the insulating layer, forming a second thin film of an inorganic insulating material on the first thin film, forming a partition including a conductive lower portion arranged on the second thin film and an upper portion protruding from a side surface of the lower portion, forming a second rib layer protruding from the side surface of the lower portion by patterning the second thin film, forming a first rib layer having a width smaller than the second rib layer by removing a part of the first thin film, which is exposed from the second rib layer, and reducing a width of the first thin film, forming a lower electrode on the insulating layer and the partition by vapor deposition, forming an organic layer which emits light in response to application of a voltage, on the lower electrode, by vapor deposition, and forming an upper electrode which is in contact with the lower portion, on the organic layer, by vapor deposition.

The light emission efficiency of the display device can be improved by these configurations.

An embodiment will be described hereinafter with reference to the accompanying drawings.

The disclosure is merely an example, and proper changes within the spirit of the invention, which are easily conceivable by a person of ordinary skill in the art, are included in the scope of the invention as a matter of course. In addition, in some cases, in order to make the description clearer, the widths, thicknesses, shapes and the like, of the respective parts are schematically illustrated in the drawings, compared to the actual modes. However, the schematic illustration is merely an example, and adds no restriction to the interpretation of the invention. In addition, in the specification and drawings, structural elements which function in the same or a similar manner to those described in connection with preceding drawings are denoted by like reference numbers, detailed description thereof being omitted unless necessary.

In the figures, an X-axis, a Y-axis and a Z-axis orthogonal to each other are described to facilitate understanding as needed. A direction along the X-axis is referred to as a first direction X, a direction along the Y-axis is referred to as a second direction Y, and a direction along the Z-axis is referred to as a third direction Z. Viewing various elements parallel to the third direction Z is referred to as plan view.

The display device of this embodiment is an organic electroluminescent display device comprising an organic light emitting diode (OLED) as a display element, and can be mounted on televisions, personal computers, vehicle-mounted devices, tablet terminals, smartphones, mobile phones, and the like.

FIG. 1 is a view showing a configuration example of a display device DSP according to the embodiment. The display device DSP has a display area DA where images are displayed and a surrounding area SA around the display area DA, on an insulating substrate 10. The substrate 10 may be glass or a flexible resin film.

In the embodiment, the shape of the substrate 10 in plan view is a rectangular shape. However, the shape of the substrate 10 in plan view is not limited to a rectangular shape, but may be any other shape such as a square, a circle or an ellipse.

The display area DA includes a plurality of pixels PX arrayed in a matrix in the first direction X and the second direction Y. Each of the pixels PX includes a plurality of sub-pixels SP. As an example, each pixel PX includes a blue sub-pixel SP1, a green sub-pixel SP2 and a red sub-pixel SP3. The pixel PX may include sub-pixels SP of other colors such as a white color together with the sub-pixels SP1, SP2, and SP3 or instead of any of the sub-pixels SP1, SP2, and SP3.

The sub-pixel SP comprises a pixel circuit 1 and a display element DE driven by the pixel circuit 1. The pixel circuit 1 comprises a pixel switch 2, a drive transistor 3, and a capacitor 4. The pixel switch 2 and the drive transistor 3 are, for example, switching elements constituted by thin-film transistors.

A gate electrode of the pixel switch 2 is connected to a scanning line GL. One of a source electrode and a drain electrode of the pixel switch 2 is connected to a signal line SL, and the other is connected to a gate electrode of the drive transistor 3 and the capacitor 4. In the drive transistor 3, one of the source electrode and the drain electrode is connected to the power line PL and the capacitor 4, and the other is connected to the display element DE. The display element DE is an organic light-emitting diode (OLED) serving as a light emitting element.

The configuration of the pixel circuit 1 is not limited to the example shown in the figure. For example, the pixel circuit 1 may comprise more thin-film transistors and more capacitors.

Figure 2:
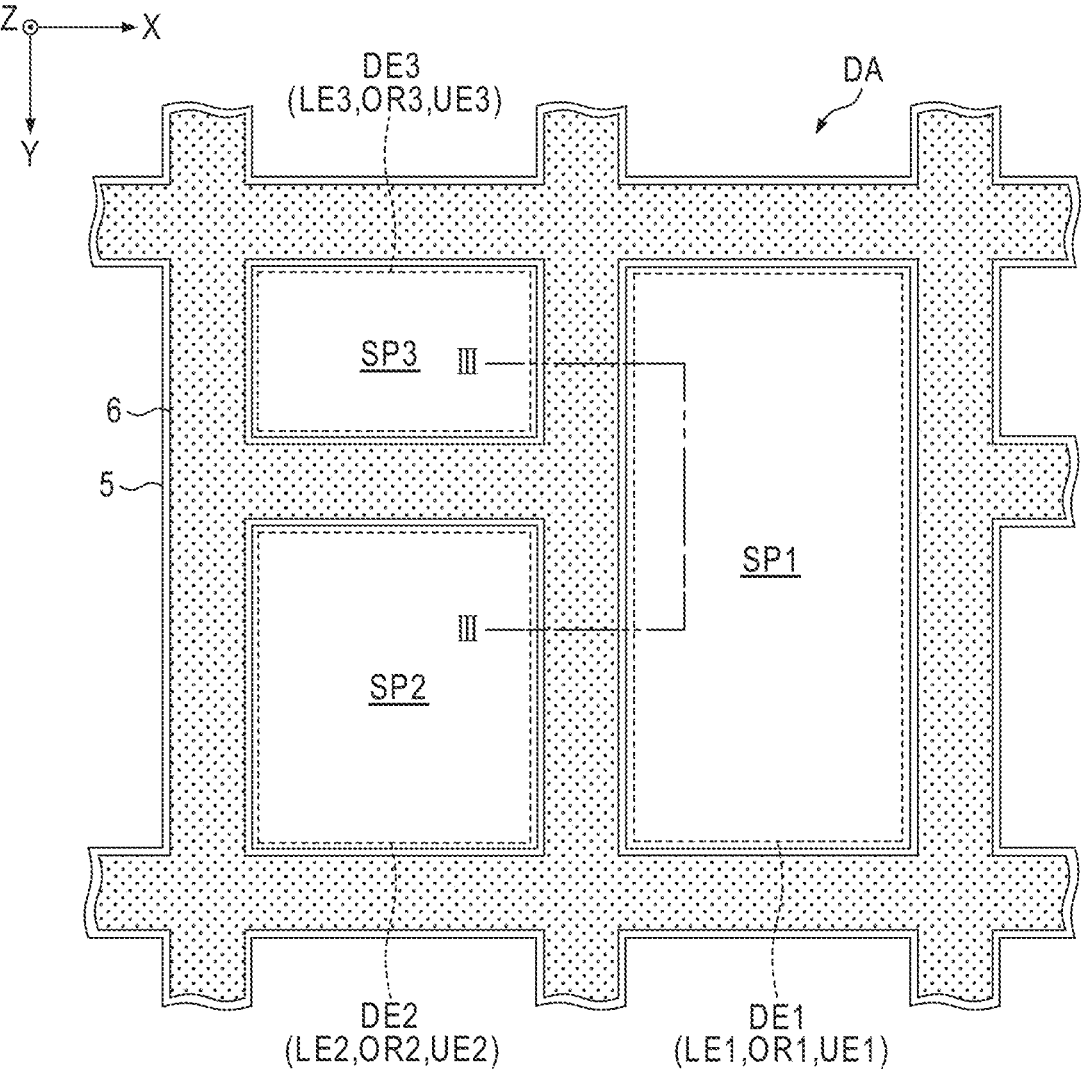
FIG. 2 is a view showing an example of a layout of sub-pixels.

FIG. 2 is a view showing an example of a layout of the sub-pixels SP1, SP2, and SP3. In the example of FIG. 2, the sub-pixels SP1 and SP2 are arranged in the first direction X. The sub-pixels SP1 and SP3 are also arranged in the first direction X. Furthermore, the sub-pixels SP2 and SP3 are arranged in the second direction Y.

When the sub-pixels SP1, SP2, and SP3 are arranged in such a layout, a row in which the sub-pixels SP2 and SP3 are alternately arranged in the second direction Y and a row in which a plurality of sub-pixels SP1 are repeatedly arranged in the second direction Y are formed in the display area DA. These rows are alternately arranged in the first direction X.

Incidentally, the layout of the sub-pixels SP1, SP2, and SP3 is not limited to the example in FIG. 2. As another example, the sub-pixels SP1, SP2, and SP3 in each pixel PX may be arranged in order in the first direction X.

The sub-pixel SP1 includes a display element DE1, the sub-pixel SP2 includes a display element DE2, and the sub-pixel SP3 includes a display element DE3. The display element DE1 includes a lower electrode LE1, an organic layer OR1, and an upper electrode UE1. The display element DE2 includes a lower electrode LE2, an organic layer OR2, and an upper electrode UE2. The display element DE3 includes a lower electrode LE3, an organic layer OR3, and an upper electrode UE3. The organic layers OR1, OR2, and OR3 emit light in response to voltages applied between the lower electrodes LE1, LE2, and LE3 and the upper electrodes UE1, UE2, and UE3, respectively. The display elements DE1, DE2, and DE3 may include cap layers to be described below.

In the example shown in FIG. 2, area of the display element DE1 is larger than area of the display element DE2. The area of the display element DE1 is larger than area of the display element DE3. Furthermore, the area of the display element DE3 is smaller than the area of the display element DE2.

A rib 5 and a partition 6 are arranged on boundaries of the sub-pixels SP1, SP2, and SP3. The rib 5 is located under the partition 6. The rib 5 and the partition 6 have a grating shape surrounding the display elements DE1, DE2, and DE3. In other words, the rib 5 and the partition 6 include a plurality of apertures that overlap with the display elements DE1, DE2, and DE3, respectively.

Figure 3:
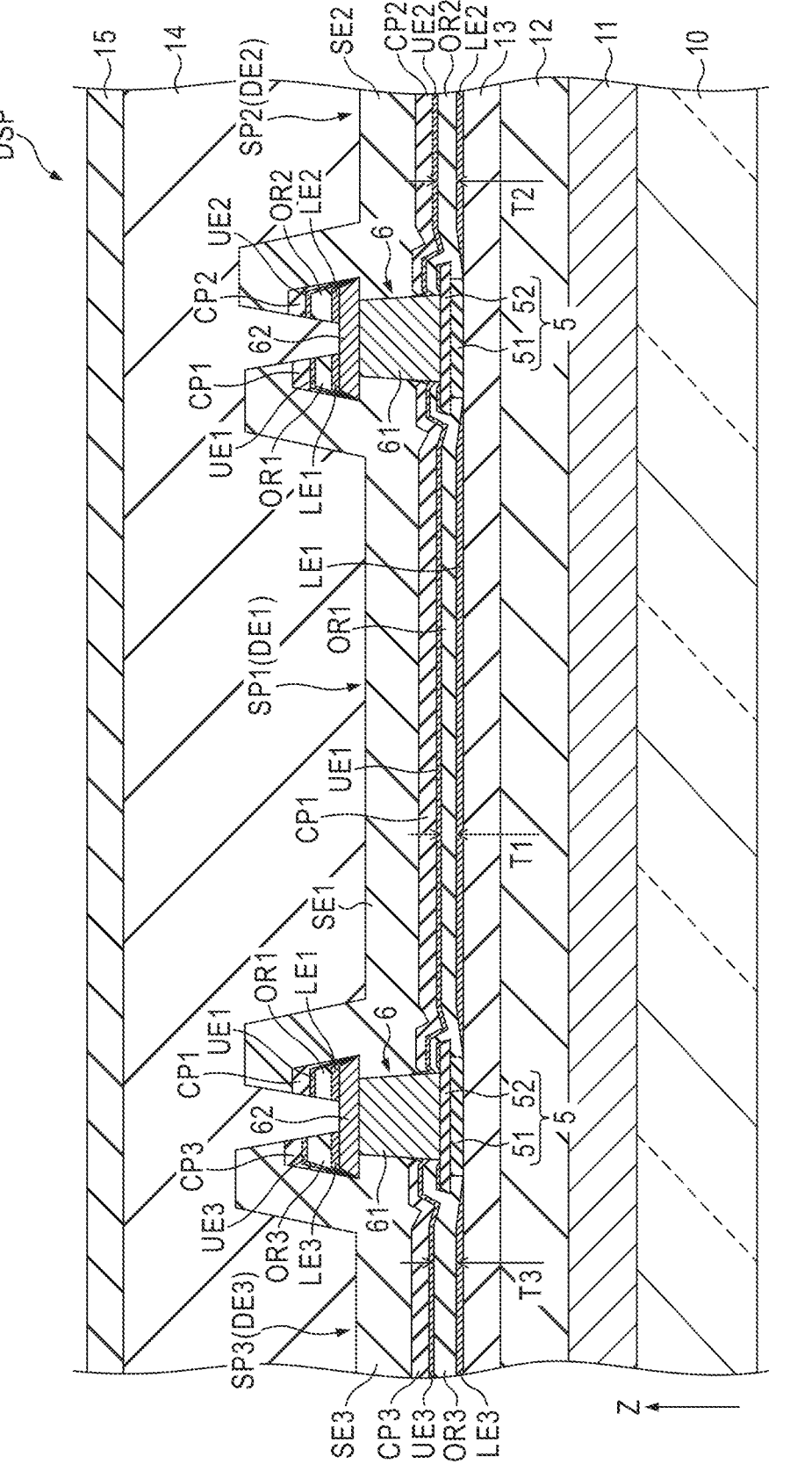
FIG. 3 is a schematic cross-sectional view showing the display device along line III-III in FIG. 2.

FIG. 3 is a schematic cross-sectional view showing the display device DSP along line III-III in FIG. 2. A circuit layer 11 is arranged on the above-described substrate 10. The circuit layer 11 includes various circuits and lines such as the pixel circuit 1, the scanning line GL, the signal line SL, and the power line PL shown in FIG. 1.

The circuit layer 11 is covered with an organic insulating layer 12. The organic insulating layer 12 is covered with an inorganic insulating layer 13. The organic insulating layer 12 functions as a planarization film for planarizing uneven parts generated by the circuit layer 11. The inorganic insulating layer 13 suppresses entry of moisture to the organic insulating layer 12 and the circuit layer 11 under the organic insulating layer 12.

The rib 5 is arranged on the inorganic insulating layer 13. In the embodiment, the rib 5 includes a first rib layer 51 arranged on the inorganic insulating layer 13 and a second rib layer 52 arranged on the first rib layer 51.

The partition 6 is arranged on the rib 5. More specifically, the partition 6 includes a conductive lower portion 61 which is arranged on the second rib layer 52 and an upper portion 62 which is arranged on the lower portion 61. The upper portion 62 has a width greater than the lower portion 61. Therefore, both end portions of the upper portion 62 protrude beyond the side surfaces of the lower portion 61 in FIG. 3. This shape of the partition 6 is referred to as overhanging.

The lower electrodes LE1, LE2, and LE3 are arranged on the inorganic insulating layer 13, similarly to the rib 5. The lower electrodes LE1, LE2, and LE3 are separated from the lower portion 61. Although not shown in the cross-section of FIG. 3, the lower electrodes LE1, LE2, and LE3 are connected to the pixel circuits 1 of the respective sub-pixels SP1, SP2, and SP3 through contact holes provided in the organic insulating layer 12 and the inorganic insulating layer 13.

The organic layer OR1 covers the lower electrode LE1, and the upper electrode UE1 covers the organic layer OR1. The organic layer OR2 covers the lower electrode LE2, and the upper electrode UE2 covers the organic layer OR2. The organic layer OR3 covers the lower electrode LE3, and the upper electrode UE3 covers the organic layer OR3. The upper electrodes UE1, UE2, and UE3 are in contact with side surfaces of the lower portion 61.

In the example shown in FIG. 3, a cap layer CP1 is arranged on the upper electrode UE1, a cap layer CP2 is arranged on the upper electrode UE2, and a cap layer CP3 is arranged on the upper electrode UE3. The cap layers CP1, CP2, and CP3 have a role as optical adjustment layers for improving the outcoupling efficiency of the light emitted from the organic layers OR1, OR2, and OR3.

A sealing layer SE1 is arranged in the sub-pixel SP1, a sealing layer SE2 is arranged in the sub-pixel SP2, and a sealing layer SE3 is arranged in the sub-pixel SP3. The sealing layer SE1 continuously covers the display element DE1 including the lower electrode LE1, the organic layer OR1, the upper electrode UE1 and the cap layer CP1, and the partition 6 around the display element DE1. The sealing layer SE2 continuously covers the display element DE2 including the lower electrode LE2, the organic layer OR2, the upper electrode UE2 and the cap layer CP2, and the partition 6 around the display element DE2. The sealing layer SE3 continuously covers the display element DE3 including the lower electrode LE3, the organic layer OR3, the upper electrode UE3 and the cap layer CP3, and the partition 6 around the display element DE3.

In the example of FIG. 3, parts of the lower electrode LE1, the organic layer OR1, the upper electrode UE1, and the cap layer CP1 are located on the upper portion 62 of the partition 6 surrounding the sub-pixel SP1. These parts are separated from parts located on the inorganic insulating layer 13, of the lower electrode LE1, the organic layer OR1, the upper electrode UE1, and the cap layer CP1 (i.e., parts constituting the display element DE1). Similarly, parts of the lower electrode LE2, the organic layer OR2, the upper electrode UE2, and the cap layer CP2 are located on the upper portion 62 of the partition 6 surrounding the sub-pixel SP2, and these parts are separated from parts located on the inorganic insulating layer 13, of the lower electrode LE2, the organic layer OR2, the upper electrode UE2, and the cap layer CP2 (i.e., parts constituting the display element DE2). In addition, parts of the lower electrode LE3, the organic layer OR3, the upper electrode UE3, and the cap layer CP3 are located on the upper portion 62 of the partition 6 surrounding the sub-pixel SP3, and these parts are separated from parts located on the inorganic insulating layer 13, of the lower electrode LE3, the organic layer OR3, the upper electrode UE3, and the cap layer CP3 (i.e., parts constituting the display element DE3).

End portions of the sealing layers SE1, SE2, and SE3 are located on the partition 6. In the example shown in FIG. 3, the end portions of the sealing layers SE1 and SE2 located on the partition 6 between the sub-pixels SP1 and SP2 are separated from each other, and the end portions of the sealing layers SE1 and SE3 located on the partition 6 between the sub-pixels SP1 and SP3 are separated from each other.

The sealing layers SE1, SE2, and SE3 are covered with a resin layer 14. The resin layer 14 is covered with a sealing layer 15. A resin layer may be further arranged on the sealing layer 15.

The inorganic insulating layer 13, the first rib layer 51, the second rib layer 52, the sealing layers SE1, SE2, and SE3, and the sealing layer 15 are formed of, for example, an inorganic insulating material such as silicon nitride (SiNx), silicon oxide (SiOx), silicon oxynitride (SiON) or aluminum oxide ($Al_2O_3$). The material of the first rib layer 51 is desirably different from any one of the materials of the inorganic insulating layer 13 and the second rib layer 52. As an example, the first rib layer 51 is formed of a silicon nitride, and the inorganic insulating layer 13 and the second rib layer 52 are formed of a silicon oxide or a silicon oxynitride.

The lower electrodes LE1, LE2, and LE3 have, for example, a single-layer structure of a metal material having an excellent optical reflectivity such as silver (Ag). Upper surfaces of the lower electrodes LE1, LE2, and LE3 are in contact with the organic layers OR1, OR2, and OR3, respectively. As another example, each of the lower electrodes LE1, LE2, and LE3 may include a reflective layer formed of a metal material such as silver, and a conductive oxide layer arranged between the reflective layer and the inorganic insulating layer 13. In this case, adherence between the lower electrodes LE1, LE2, and LE3 and the inorganic insulating layer 13 is improved as compared with a case in which the reflective layer is in contact with the inorganic insulating layer 13. Such a conductive oxide layer can be formed of, for example, a transparent conductive oxide such as indium tin oxide (ITO), indium zinc oxide (IZO), or indium gallium zinc oxide (IGZO).

The upper electrodes UE1, UE2, and UE3 are formed of, for example, a metal material such as an alloy (MgAg) of magnesium and silver. For example, the lower electrodes LE1, LE2, and LE3 correspond to anodes, and the upper electrodes UE1, UE2, and UE3 correspond to cathodes.

The cap layers CP1, CP2, and CP3 have refractive indices different from the upper electrodes UE1, UE2, and UE3 and the sealing layers SE1, SE2, and SE3. The cap layers CP1, CP2 and CP3 can be constituted by, for example, a multilayer body of a plurality of transparent thin films. As the thin films, the multilayer body may include a thin film formed of an inorganic material and a thin film formed of an organic material. In addition, the plurality of thin films have refractive indices different from each other. The materials of the thin films constituting the multilayer body are different from the materials of the upper electrodes UE1, UE2 and UE3 and are also different from the materials of the sealing layers SE1, SE2 and SE3. Incidentally, the cap layers CP1, CP2, and CP3 may be omitted.

The lower portion 61 of the partition 6 is formed of, for example, aluminum (Al). The lower portion 61 may be formed of an aluminum alloy such as aluminum-neodymium (AlNd) or may have a multilayer structure of an aluminum layer and an aluminum alloy layer. Furthermore, the lower portion 61 may include a thin film formed of a metallic material different from aluminum and an aluminum alloy, under the aluminum layer or the aluminum alloy layer. Such a thin layer can be formed of, for example, molybdenum (Mo).

The upper portion 62 of the partition 6 has, for example, a multilayer structure of a thin film formed of a metal material such as titanium (Ti) and a thin film formed of a conductive material such as ITO. The upper portion 62 may have a single-layer structure of a metal material such as titanium.

A common voltage is supplied to the partition 6. This common voltage is supplied to each of the upper electrodes UE1, UE2, and UE3 that are in contact with the side surfaces of the lower portion 61. A pixel voltage is supplied to the lower electrodes LE1, LE2, and LE3 through the pixel circuits 1 included in the respective sub-pixels SP1, SP2, and SP3.

Figure 4:
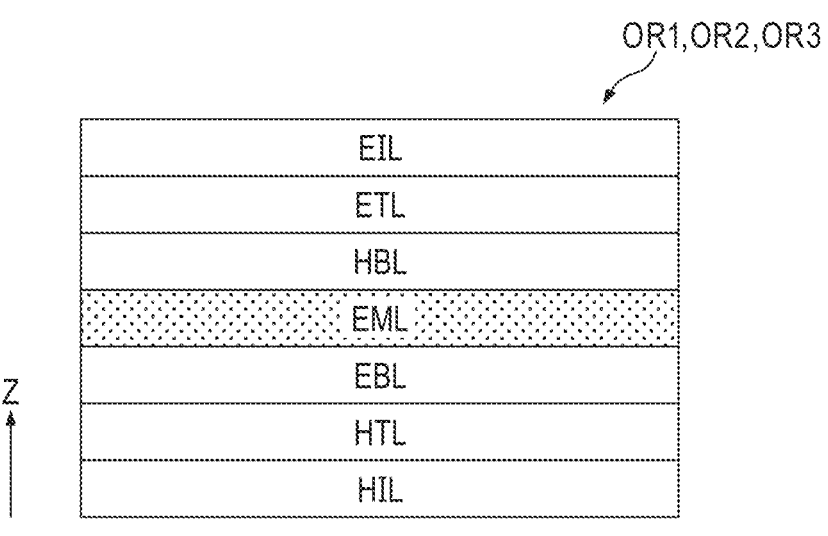
FIG. 4 is a view showing an example of a layer structure applicable to organic layers.

FIG. 4 is a view showing an example of a layer structure applicable to the organic layers OR1, OR2, and OR3. Each of the organic layers OR1, OR2, and OR3 has a structure in which, for example, a hole-injection layer HIL, a hole-transport layer HTL, an electron blocking layer EBL, a light emitting layer EML, a hole blocking layer HBL, an electron-transport layer ETL, and an electron-injection layer EIL are stacked in this order in the third direction Z. The organic layers OR1, OR2, and OR3 may have a so-called tandem structure including a plurality of light emitting layers EML.

When a potential difference is formed between the lower electrode LE1 and the upper electrode UE1, the light emitting layer EML of the organic layer OR1 emits light of the blue wavelength range. When a potential difference is formed between the lower electrode LE2 and the upper electrode UE2, the light emitting layer EML of the organic layer OR2 emits light of the green wavelength range. When a potential difference is formed between the lower electrode LE3 and the upper electrode UE3, the light emitting layer EML of the organic layer OR3 emits light of the red wavelength range.

The thickness of the organic layers OR1, OR2, and OR3 is desirably adjusted in accordance with the wavelength of the light emitted from the light emitting layer EML, from the viewpoint of improving the light outcoupling efficiency of the display elements DE1, DE2, and DE3. In the example shown in FIG. 3, a thickness T1 of the organic layer OR1, a thickness T2 of the organic layer OR2, and a thickness T3 of the organic layer OR3 are different from each other. More specifically, the thickness T2 is greater than the thickness T1, and the thickness T3 is greater than the thickness T2 (T1<T2<T3). The difference among the thicknesses T1, T2, and T3 is caused by, for example, the difference in thickness among the hole-transport layers HTL in the respective organic layers OR1, OR2, and OR3, but is not limited to this example.

Figure 5:
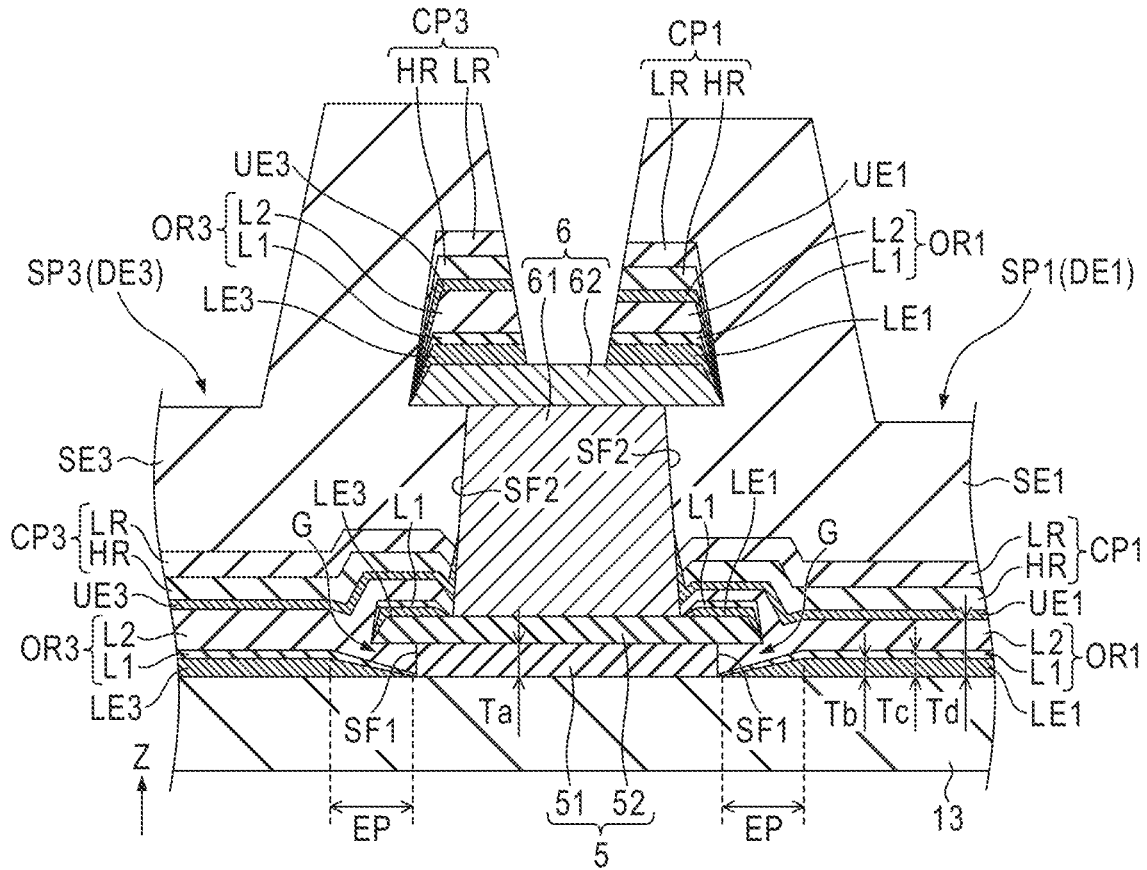
FIG. 5 is an enlarged cross-sectional view schematically showing a partition and a vicinity of the partition.

FIG. 5 is an expanded cross-sectional view schematically showing the partition 6 arranged between the sub-pixels SP1 and SP3 and a vicinity of the partition 6. The first rib layer 51 has a pair of side surfaces SF1. A width of the first rib layer 51 is smaller than a width of the second rib layer 52. The second rib layer 52 thereby protrudes from each of the side surfaces SF1 in a width direction (first direction X or second direction Y) of the rib 5 and the partition 6. A gap G is formed between the portion of the second rib layer 52, which protrudes from the side surface SF1, and the inorganic insulating layer 13.

The lower portion 61 has a pair of side surfaces SF2. A width of the upper portion 62 is larger than a width of the lower portion 61. In addition, the width of the second rib layer 52 is also larger than the width of the lower portion 61. The upper portion 62 and the second rib layer 52 thereby protrude from each of the side surfaces SF2 in the width direction.

The lower electrode LE1 includes an end portion EP having a thickness reduced toward the first rib layer 51. In the example shown in FIG. 5, a part of the end portion EP is located in the gap GP. The end portion EP may be in contact with or separated from the side surface SF1 of the first rib layer 51. Alternatively, the end portion EP may be entirely located outside the gap G.

The organic layer OR1 includes a first layer L1 covering the lower electrode LE1 and a second layer L2 covering the first layer L1. At least the hole-injection layer HIL of each layer shown in FIG. 4 is included in the first layer L1, and the layers which are not included in the first layer L1 are included in the second layer L2. As an example, the first layer L1 is constituted by the hole-injection layer HIL, and the second layer L2 is constituted by the hole-transport layer HTL, the electron blocking layer EBL, the light emitting layer EML, the hole blocking layer HBL, the electron-transport layer ETL, and the electron-injection layer EIL.

For example, the organic layer OR1 fills the gap G. In the example shown in FIG. 5, parts of the first layer L1 and the second layer L2 fill the gap G. As another example, a gap which is not filled with the lower electrode LE1, the first layer L1, or the second layer L2 may be formed inside the gap G.

In the example shown in FIG. 5, parts of the lower electrode LE1 and the first layer L1 are located on the second rib layer 52. These parts are separated from parts located on the inorganic insulating layer 13, of the lower electrode LE1 and the first layer L1 (i.e., parts constituting the display element DE1).

For example, the second layer L2 covers the lower electrode LE1 and the first layer L1 located on the second rib layer 52 without being interrupted by the gap G. The second layer L2 may be in contact with or separated from the side surface SF2 as shown in FIG. 5.

The upper electrode UE1 entirely covers the second layer L2 of the organic layer OR1 without being interrupted in the vicinity of the gap G. Furthermore, the upper electrode UE1 is in contact with the side surface SF2.

The cap layer CP1 includes a high refractive index layer HR covering the upper electrode UE1 and a low refractive index layer LR covering the high refractive index layer HR. The low refractive index layer LR has a refractive index smaller than the high refractive index layer HR. The high refractive index layer HR and the low refractive index layer LR are examples of a plurality of transparent thin films constituting the above-described multilayer body. The cap layer CP1 may include more thin films.

Similarly to the end portion EP of the lower electrode LE1, the thickness of the organic layer OR1 may be reduced toward the side surfaces SF1 and SF2, and the thicknesses of the upper electrode UE1 and the cap layer CP1 may be reduced toward the side surface SF2.

An area which is not covered with the upper electrode UE1, of the side surface SF2 facing the sub-pixel SP1, is covered with the sealing layer SE1. The sealing layer SE1 also continuously covers a lower surface of the upper portion 62, and the stacked layer body of the lower electrode LE1, the organic layer OR1, the upper electrode UE1, and the cap layer CP1, which is arranged on the upper portion 62.

If the lower electrode LE1 is brought into contact with the lower portion 61, the lower electrode LE1 becomes electrically conductive with the upper electrode UE1, and the light emitting layer EML of the organic layer OR1 does not emit light. The lower electrode LE1 therefore needs to be separated from the lower portion 61. Then, a thickness Ta of the first rib layer 51 (i.e., the height of the gap G) is desirably larger than a thickness Tb of the lower electrode LE1 (Ta>Tb). Thus, the lower electrode LE1 can hardly surmount the gap G, and can suppress a short circuit between the lower electrode LE1 and the lower portion 61. As an example, the thickness Ta is 150 nm, and the thickness Tb is 100 nm. A depth of the gap G, i.e., a length of the protrusion of the second rib layer 52 from the side surface SF1 is equivalent to, for example, the thickness Ta.

When the hole-injection layer HIL of the organic layer OR1 is brought into contact with the lower portion 61, an undesired current leakage path can easily be formed. For this reason, the hole-injection layer HIL of the organic layer OR1 also needs to be separated from the lower portion 61. Then, the thickness Ta is desirably larger than a total thickness Tc of the lower electrode LE1 and the hole-injection layer HIL (Ta>Tc). A short circuit between the hole-injection layer HIL and the lower portion 61 can also be thereby suppressed desirably.

In contrast, the upper electrode UE1 needs to be in contact with the lower portion 61. Thus, the thickness Ta is desirably smaller than a total thickness Td of the lower electrode LE1 and the organic layer OR1 (Ta<Td). The gap G can easily be thereby filled with the organic layer OR1. If the gap G is filled with the organic layer OR1, the upper electrode UE1 on the organic layer OR1 is brought into contact with the side surface SF2 without being interrupted by the gap G.

Incidentally, each of the thicknesses Tb, Tc, and Td is, for example, an average thickness measured based on parts excluding a vicinity of an end portion whose thickness is reduced, of the lower electrode LE1 and the organic layer OR1.

The configuration of the lower electrode LE3, the organic layer OR3, the upper electrode UE3, the cap layer CP3, and the sealing layer SE3 shown in FIG. 5 is the same as the configuration of the lower electrode LE1, the organic layer OR1, the upper electrode UE1, the cap layer CP1, and the sealing layer SE1. In addition, the configuration of the lower electrode LE2, the organic layer OR2, the upper electrode UE2, the cap layer CP2, and the sealing layer SE2 is also the same as the configuration of the lower electrode LE1, the organic layer OR1, the upper electrode UE1, the cap layer CP1, and the sealing layer SE1. For example, the thickness of each of the lower electrodes LE2 and LE3 is the same as the thickness Tb of the lower electrode LE1.

Figure 6:
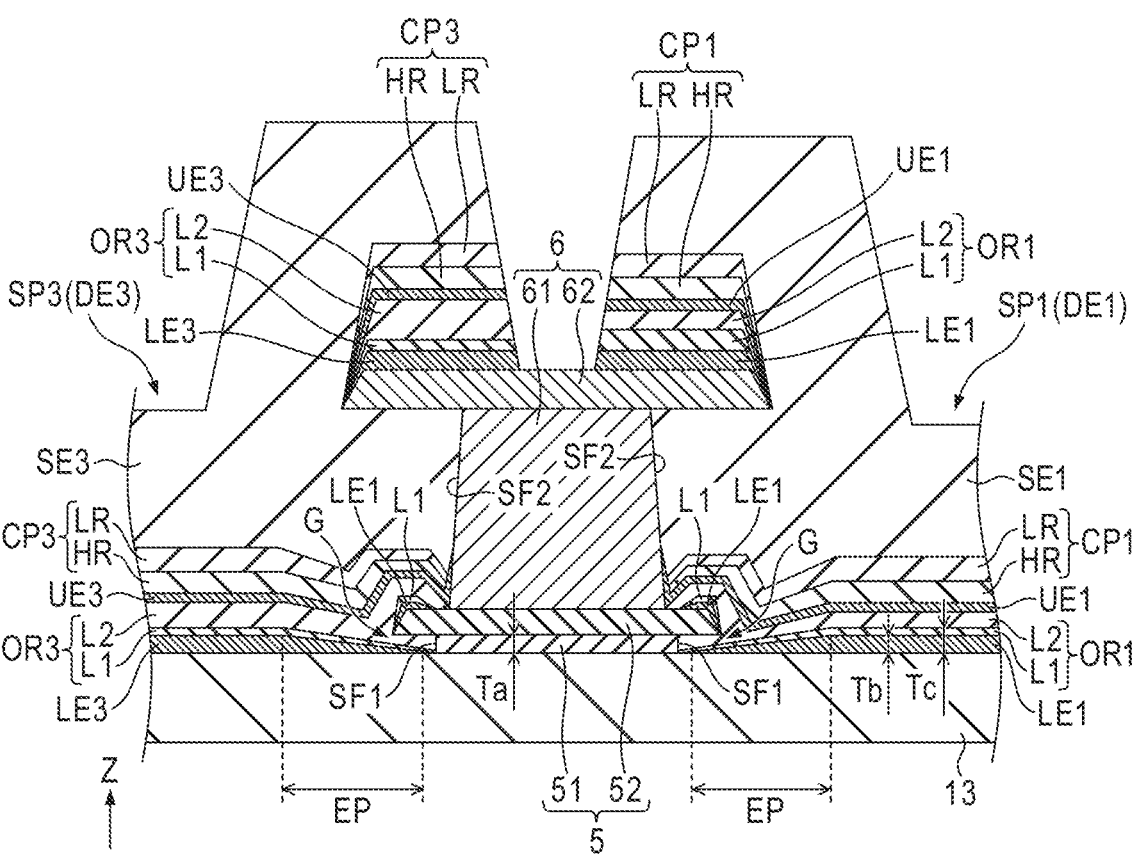
FIG. 6 is a schematic cross-sectional view showing another structure that can be applied to the partition and its vicinity.

FIG. 6 is a schematic cross-sectional view showing another structure that can be applied to the partition 6 and its vicinity. In the above-described example shown in FIG. 5, the width of the second rib layer 52 is larger than the width of the upper portion 62. In contrast, in the example shown in FIG. 6, the width of the second rib layer 52 is smaller than the width of the upper portion 62.

As described later, the lower electrode LE1 is formed by vapor deposition. In this deposition process, part of the deposition material released from a deposition source toward a vicinity of a proximal part of the lower portion 61 is blocked by the upper portion 62, and the end portions EP having a thickness reduced toward the first rib layer 51 are formed. As shown in the example of FIG. 6, the thickness of the end portion EP in the vicinity of the gap G is reduced as the width of the upper portion 62 is made larger. Therefore, a short circuit between the lower electrode LE1 and the lower portion 61 can be suppressed more reliably. The lower electrodes LE2 and LE3 are constituted in the same manner.

In the example shown in FIG. 6, the thickness Ta may be smaller than or equal to the thickness Tb or the thickness Tc. More specifically, when the thickness Tb is 100 nm, the thickness Ta can be set to approximately 75 nm. Even in this case, if the thicknesses of the lower electrodes LE1, LE2, and LE3 are sufficiently reduced below the upper portion 62, the lower electrodes LE1, LE2, and LE3 are separated by the gap G. Therefore, a short circuit between the lower electrodes LE1, LE2, and LE3 and the lower portion 61 can be prevented.

Next, a method of manufacturing the display device DSP will be described.

FIG. 7 is a flowchart showing an example of a method of manufacturing the display device DSP. Each of FIG. 8 to FIG. 23 is a schematic cross-sectional view showing parts of the manufacturing process of the display device DSP. In FIG. 8 to FIG. 23, the substrate 10 and the circuit layer 11 are omitted.

Figure 8:
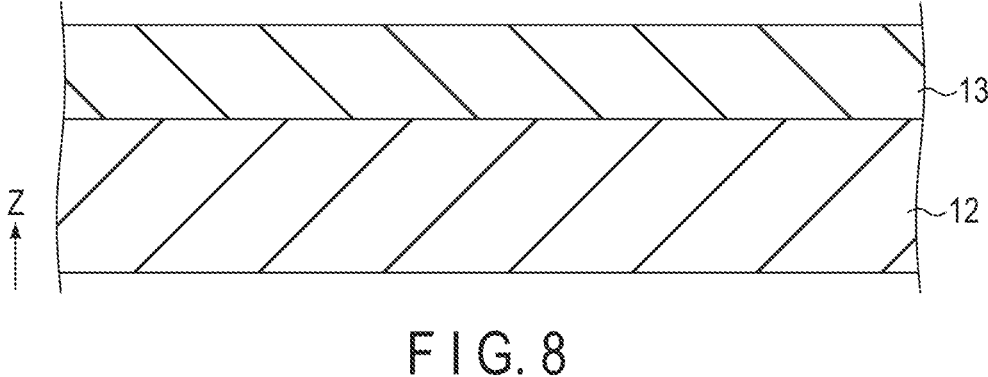
FIG. 8 is a schematic cross-sectional view showing a process of manufacturing the display device.

In manufacturing the display device DSP, the circuit layer 11 and the organic insulating layer 12 are first formed on the substrate 10 (process P1). Furthermore, as shown in FIG. 8, the inorganic insulating layer 13 is formed on the organic insulating layer 12 (process P2).

Figure 9:
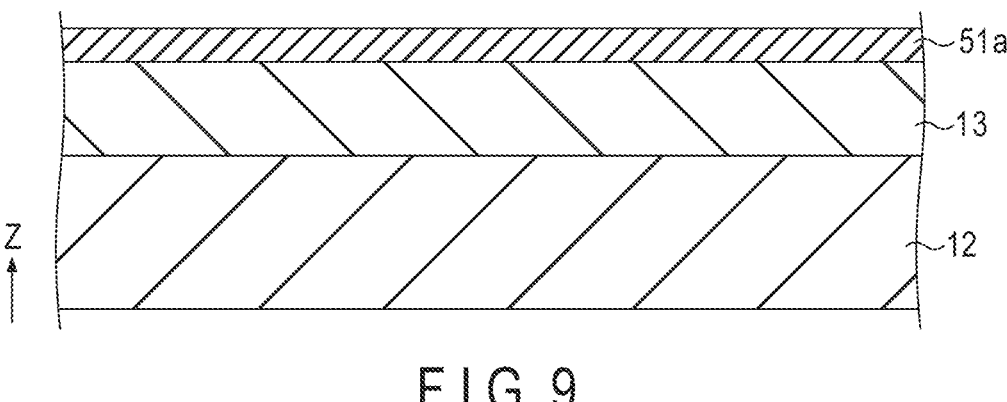
FIG. 9 is a schematic cross-sectional view showing a manufacturing process following FIG. 8.
Figure 10:
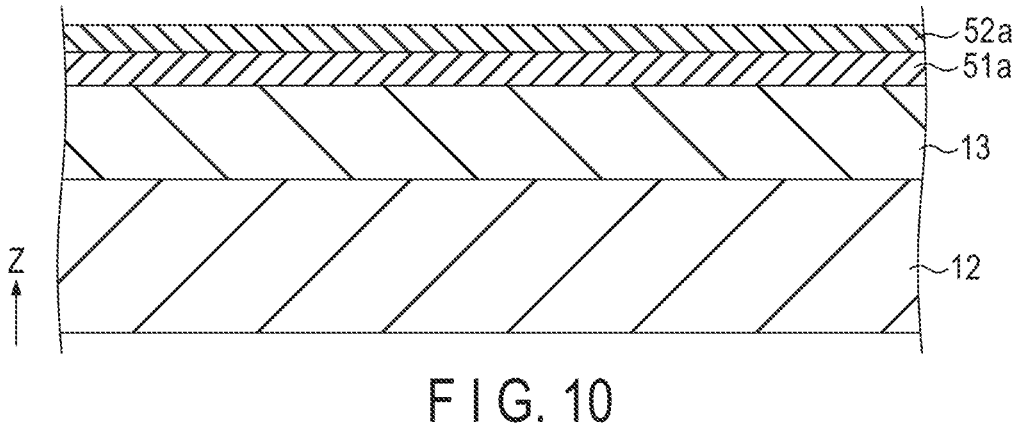
FIG. 10 is a schematic cross-sectional view showing a manufacturing process following FIG. 9.

After process P2, the rib 5 and the partition 6 are formed on the inorganic insulating layer 13 (process P3). More specifically, as shown in FIG. 9, a first thin film 51a of an inorganic insulating material which is to be the first rib layer 51 is first formed on the inorganic insulating layer 13 by Chemical Vapor Deposition (CVD). Furthermore, as shown in FIG. 10, a second thin film 52a of an inorganic insulating material which is to be the second rib layer 52 is formed on the first thin film 51a by CVD.

Figure 11:
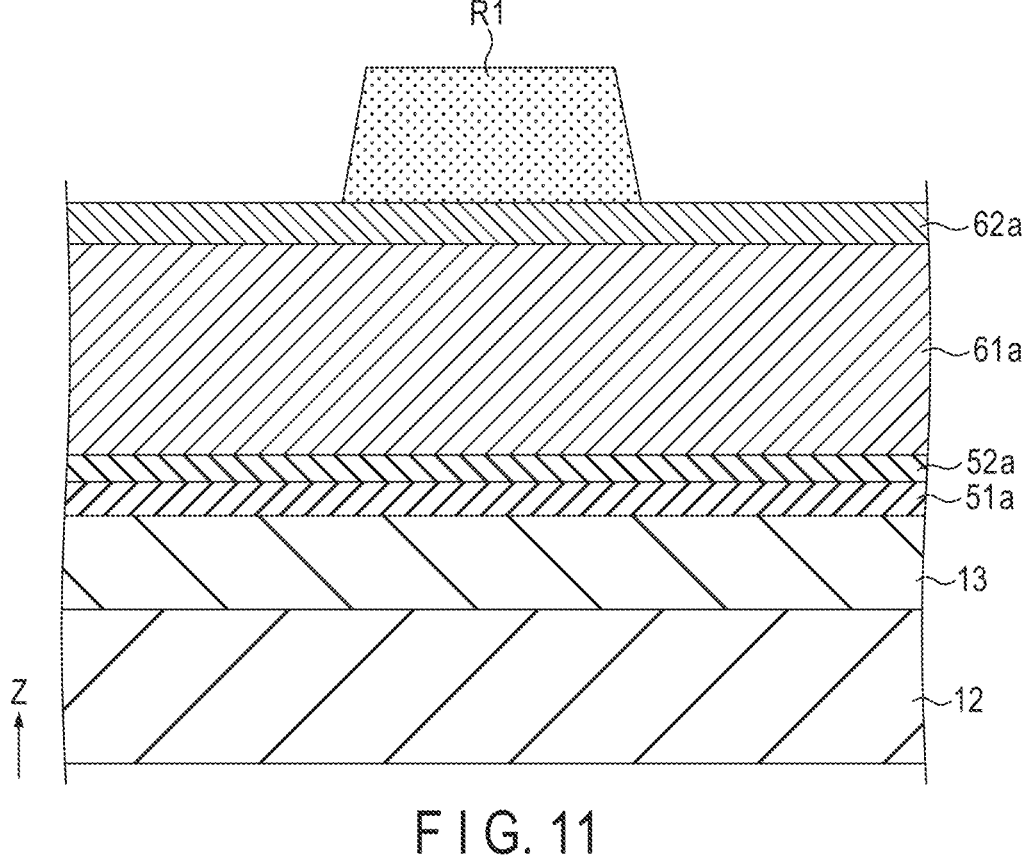
FIG. 11 is a schematic cross-sectional view showing a manufacturing process following FIG. 10.

Next, as shown in FIG. 11, a metal layer 61a which is to be the lower portion 61 is formed on the second thin film 52a, and a thin film 62a which is to be the upper portion 62 is formed on the metal layer 61a. Furthermore, a resist R1 corresponding to the shape of the partition 6 is formed on the thin film 62a.

After the formation of the resist R1, a portion of the thin film 62a, which is exposed from the resist R1, is removed by, for example, wet etching as shown in FIG. 12. The upper portion 62 is thereby formed.

Then, anisotropic dry etching is executed to remove the part of the metal layer 61a, which is exposed from the resist R1, as shown in FIG. 13. In the dry etching, the part of the metal layer 61a, which is exposed from the resist R1, may be thinned to remain.

Next, isotropic wet etching is executed such that the width of the metal layer 61a is reduced to be smaller than the width of the upper portion 62 as shown in FIG. 14. Thus, the lower portion 61 having a width smaller than the upper portion 62 is formed, and the partition 6 is completed.

After that, the first thin film 51a and the second thin film 52a are patterned. More specifically, anisotropic dry etching is executed to remove the part of the second thin film 52a, which is exposed from the lower portion 61, as shown in FIG. 15. In the dry etching, since the upper portion 62 acts as a mask, the portion of the second thin film 52a, which is located under the upper portion 62, remains. The second rib layer 52 having a width greater than the lower portion 61 is thereby formed.

Furthermore, isotropic dry etching is executed to remove the part of the first thin film 51a, which is exposed from the second rib layer 52, as shown in FIG. 16. In the dry etching, the width of the first thin film 51a is reduced to be smaller than the width of the second rib layer 52. Thus, the first rib layer 51 having a width smaller than the second rib layer 52 is formed, and the rib 5 is completed. After that, the resist R1 is removed as shown in FIG. 17.

For example, anisotropic dry etching in FIG. 15 and isotropic dry etching in FIG. 16 can be executed in the same chamber. In this case, anisotropic dry etching may be first executed with a high bias power and then isotropic dry etching may be executed by switching the bias power to a low bias power.

To suppress erosion of the inorganic insulating layer 13 and the second rib layer 52 by isotropic dry etching shown in FIG. 16, the inorganic insulating layer 13 and the second rib layer 52 are desirably formed of a material in which an etching rate of the dry etching is slower than the first rib layer 51 (first thin film 51*a*). For example, when the inorganic insulating layer 13 and the second rib layer 52 are formed of a silicon oxide or a silicon oxynitride and the first rib layer 51 is formed of a silicon nitride as described above, the relationship in etching rate is implemented.

The method of forming the rib 5 and the partition 6 is not limited to that shown in FIG. 8 to FIG. 17. For example, the resist R1 may be removed before executing the dry etching in FIG. 15 and FIG. 16, and a new resist having a plane shape corresponding to the second rib layer 52 may be arranged. If the dry etching in FIG. 15 and FIG. 16 is executed using this resist as a mask, the second rib layer 52 and the first rib layer 51 located under the second rib layer 52 can be formed with a good accuracy.

After process P3, the display element DE1 is formed (process P4). More specifically, as shown in FIG. 18, the lower electrode LE1 is formed on the inorganic insulating layer 13 and the partition 6 by vapor deposition (process P11), the organic layer OR1 is formed on the lower electrode LE1 by vapor deposition (process P12), the upper electrode UE1 is formed on the organic layer OR1 by vapor deposition (process P13), and the cap layer CP1 is formed on the upper electrode UE1 by vapor deposition (process P14). Furthermore, the sealing layer SE1 is formed by CVD (process P15).

Incidentally, process P12 includes a process of sequentially forming the thin films constituting the organic layer OR1, such as the hole-injection layer HIL, the hole-transport layer HTL, the electron blocking layer EBL, the light emitting layer EML, the hole blocking layer HBL, the electron-transport layer ETL, the electron-injection layer EIL, and the like shown in FIG. 4. In addition, process P14 includes a process of sequentially forming the thin films constituting the cap layer CP1, such as the high refractive index layer HR and the low refractive index layer LR shown in FIG. 5.

The lower electrode LE1, the organic layer OR1, the upper electrode UE1, the cap layer CP1, and the sealing layer SE1 are formed in at least the entire display area DA, and are arranged in not only the sub-pixel SP1 but also the sub-pixels SP2 and SP3. The lower electrode LE1, the organic layer OR1, the upper electrode UE1, and the cap layer CP1 are divided by the overhanging partition 6. The lower electrode LE1 is separated from the lower portion 61, and the upper electrode UE1 is in contact with the side surfaces of the lower portion 61. The sealing layer SE1 continuously covers the display element DE1 including the lower electrode LE1, the organic layer OR1, the upper electrode UE1 and the cap layer CP1, and the partition 6.

When the lower electrode LE1 is deposited, the deposition material released from a deposition source to move to the vicinity of a proximal part of the lower portion 61 is blocked by the upper portion 62. For this reason, the thickness of the end portions EP of the lower electrode LE1 is reduced toward the lower portion 61, which is also shown in FIG. 5. End portions of the organic layer OR1, the upper electrode UE1, and the cap layer CP1 are formed in a similar state.

At least processes P11 and P12, desirably processes P11 to P15 are sequentially executed in a vacuum environment. In other words, during at least a period from the start of process P11 until the completion of process P12, the surrounding of the substrate to be processed during these processes is continuously maintained in a vacuum state. Therefore, the lower electrode LE1 formed in process P11 is covered with a lower most layer (for example, the hole-injection layer HIL) of the organic layer OR1 in process P12 without being brought into contact with atmosphere.

After process P15, a resist R2 is arranged on the sealing layer SE1 as shown in FIG. 19 (process P16). The resist R2 covers the sub-pixel SP1 and a part of the partition 6 in the surrounding of the sub-pixel SP1.

After that, as shown in FIG. 20, the lower electrode LE1, the organic layer OR1, the upper electrode UE1, the cap layer CP1, and the sealing layer SE1 are patterned using the resist R2 as a mask (process P17). This process includes dry etching and wet etching for sequentially removing parts exposed from the resist R2, of the lower electrode LE1, the organic layer OR1, the upper electrode UE1, the cap layer CP1, and the sealing layer SE1.

After process P17, the resist R2 is removed by a stripper, and the residue of the resist R2 or the like is removed by asking (process P18). As a result, as shown in FIG. 21, a substrate in which the display element DE1 and the sealing layer SE1 are formed in the sub-pixel SP1 and no display elements or sealing layers are formed in the sub-pixels SP2 and SP3 can be obtained.

After the formation of the display element DE1, the display element DE2 is formed (process P5). The procedure of forming the display element DE2 is the same as processes P11 to P18. In other words, similarly to processes P11 to P15, the lower electrode LE2, the organic layer OR2, the upper electrode UE2, and the cap layer CP2 are formed in order by vapor deposition, and the sealing layer SE2 is formed by CVD. Since at least the lower electrode LE2 and the organic layer OR2 are continuously formed in a vacuum environment, the lower electrode LE2 is covered with the organic layer OR2 without being brought into contact with atmosphere.

After that, the resist is arranged on the sealing layer SE2 similarly to process P16, and the lower electrode LE2, the organic layer OR2, the upper electrode UE2, the cap layer CP2, and the sealing layer SE2 are patterned similarly to process P17. After the patterning, the resist is removed similarly to process P18.

After the above-described processes, a substrate in which the display element DE1 and the sealing layer SE1 are formed in the sub-pixel SP1, the display element DE2 and the sealing layer SE2 are formed in the sub-pixel SP2, and no display elements or sealing layers are formed in the sub-pixel SP3 can be obtained as shown in FIG. 22.

After the formation of the display element DE2, the display element DE3 is formed (process P6). The procedure of forming the display element DE3 is the same as processes P11 to P18. In other words, similarly to processes P11 to P15, the lower electrode LE3, the organic layer OR3, the upper electrode UE3, and the cap layer CP3 are formed in order by vapor deposition, and the sealing layer SE3 is formed by CVD. Since at least the lower electrode LE3 and the organic layer OR3 are continuously formed in a vacuum environment, the lower electrode LE3 is covered with the organic layer OR3 without being brought into contact with atmosphere.

After that, the resist is arranged on the sealing layer SE3 similarly to process P16, and the lower electrode LE3, the organic layer OR3, the upper electrode UE3, the cap layer CP3, and the sealing layer SE3 are patterned similarly to process P17. After the patterning, the resist is removed similarly to process P18.

After the above-described processes, a substrate in which the display element DE1 and the sealing layer SE1 are formed in the sub-pixel SP1, the display element DE2 and the sealing layer SE2 are formed in the sub-pixel SP2, and the display element DE3 and the sealing layer SE3 are formed in the sub-pixel SP3 can be obtained as shown in FIG. 23.

After process P6, the resin layer 14 and the sealing layer 15 shown in FIG. 3 are formed in order (process P7). The display device DSP is thereby completed. It has been assumed that the display element DE1 is first formed, then the display element DE2 is formed, and finally the display element DE3 is formed in the above-described manufacturing process, but the formation order of the display elements DE1, DE2, and DE3 is not limited to this example.

In a conventional organic electroluminescent display devices, the lower electrode is patterned in the photolithography process before forming the organic layer and the upper electrode. For example, when the lower electrode has a single-layer structure of silver, the silver surface is exposed to acidic or alkaline chemicals or atmosphere in the process of patterning the lower electrode and various processes to be executed subsequently. This can cause the surface to be altered by sulfurization or oxidation, resulting in a decrease in reflectance. In addition, if the lower electrode is made to have a single layer structure of silver, sufficient adherence with the underlying insulating layer cannot be secured, and the lower electrode may be peeled off. Therefore, a structure in which the lower surface and the upper surface of the reflective layer formed of silver are covered with ITO is generally used for the lower electrode. In this structure, alteration of the upper surface of the reflective layer is suppressed by the upper ITO layer, and adhesion between the reflective layer and the base is improved by the lower ITO layer. The upper ITO layer has a thickness of, for example, approximately 5 to 10 nm.

Light emitted by the organic layer is repeatedly reflected at the interfaces of the reflective layer and each layer arranged above the reflective layer, and is emitted from the display element. If the upper surface of the reflective layer is covered with an ITO layer, part of the light is absorbed by the ITO layer in the process of this multiple reflection. In particular, since light of the blue wavelength range has a high absorption index in the ITO layer, the loss is great. When dry etching or wet etching using acidic chemicals is executed after the formation of the lower electrode, the upper ITO layer needs to be thickened to, for example, approximately 20 to 30 nm, and the loss caused by light absorption becomes even greater.

In contrast, the lower electrode LE1 and the organic layer OR1 are continuously deposited in a vacuum environment, in the method of manufacturing the display device DSP according to the embodiment. The lower electrode LE2 and the organic layer OR2, and the lower electrode LE3 and the organic layer OR3 are deposited in the same manner. In this case, the surfaces of the lower electrodes LE1, LE2, and LE3 are not exposed to the atmosphere or chemicals. Therefore, the upper surfaces of the lower electrodes LE1, LE2, and LE3, which are formed of metal materials such as silver, do not need to be covered with the ITO layer. By omitting the ITO layer, the absorption of light emitted by the organic layers OR1, OR2, and OR3 is suppressed. Furthermore, since the alteration of the upper surfaces of the lower electrodes LE1, LE2, and LE3 is suppressed, good hole injection characteristics can be secured. The light emission efficiency of the display elements DE1, DE2, and DE3 is improved by these factors.

In addition, since the organic layers OR1, OR2, and OR3, and the like are formed immediately after the lower electrodes LE1, LE2, and LE3 are formed, the peeling of the lower electrodes LE1, LE2, and LE3 is suppressed without providing the lower ITO layer. In the embodiment, the overhanging partition 6 is provided at the boundary of the sub-pixels SP1, SP2, and SP3. In this case, the lower electrodes LE1, LE2, and LE3, the organic layers OR1, OR2, and OR3, the upper electrodes UE1, UE2, and UE3, and the like formed by vapor deposition are divided by the partition 6. By covering each layer thus divided with the sealing layers SE1, SE2, and SE3, the individually sealed display elements DE1, DE2, and DE3 can be obtained. If the display elements DE1, DE2, and DE3 are individually sealed, the spread of the influence to the other display elements is suppressed even in a case where a defect such as entry of moisture occurs in any one of the display elements.

The partition 6 plays a role of a wire which supplies power to the upper electrodes UE1, UE2, and UE3. For this reason, the lower electrodes LE1, LE2, and LE3 need to be separated from the portion 6. In this regard, in the embodiment, the upper portion 62 of the partition 6 protrudes beyond the side surfaces of the lower portion 61. In this case, the end portions EP of the lower electrodes LE1, LE2, and LE3 formed by vapor deposition have a shape whose thickness is reduced toward the lower portion 61 as described above. The contact between the lower electrodes LE1, LE2, and LE3 and the lower portion 61 can be thereby suppressed desirably.

Furthermore, in the embodiment, the rib 5 arranged between the lower portion 61 and the inorganic insulating layer 13 includes the first rib layer 51 and the second rib layer 52 located on the first rib layer 51, and the second rib layer 52 protrudes from the side surfaces SF1 of the first rib layer 51 and the side surfaces SF2 of the lower portion 61. In this configuration, even if these materials are adhered to the side surface SF2 of the lower portion 61 during the deposition of the lower electrodes LE1, LE2, and LE3, the adhered portions are separated from the other portions of the lower electrodes LE1, LE2, and LE3, respectively, by the gap G. Therefore, a short circuit between the lower electrodes LE1, LE2, and LE3 and the lower portion 61 can be suppressed more reliably. In addition, since the lower electrodes LE1, LE2, and LE3 can be made closer to the lower portion 61 while suppressing such a short circuit, the area of the display elements DE1, DE2, and DE3 (i.e., the area of light emission area) can be secured widely.

All of the display devices and manufacturing methods that can be implemented by a person of ordinary skill in the art through arbitrary design changes to the display device and manufacturing method described above as each embodiment of the present invention come within the scope of the present invention as long as they are in keeping with the spirit of the present invention.

Various types of the modified examples are easily conceivable within the category of the ideas of the present invention by a person of ordinary skill in the art and the modified examples are also considered to fall within the scope of the present invention. For example, additions, deletions or changes in design of the constituent elements or additions, omissions, or changes in condition of the processes arbitrarily conducted by a person of ordinary skill in the art, in the above embodiments, fall within the scope of the present invention as long as they are in keeping with the spirit of the present invention.

In addition, the other advantages of the aspects described in the embodiments, which are obvious from the descriptions of the present specification or which can be arbitrarily conceived by a person of ordinary skill in the art, are considered to be achievable by the present invention as a matter of course.

What is claimed is:

1. A display device comprising:

an insulating layer formed of an inorganic insulating material;

a lower electrode arranged on the insulating layer;

a rib arranged on the insulating layer and surrounding the lower electrode;

a partition including a conductive lower portion arranged on the rib and an upper portion protruding from a side surface of the lower portion, and surrounding the lower electrode;

an organic layer covering the lower electrode and emitting light in response to application of a voltage; and an upper electrode covering the organic layer and contacting the lower portion, wherein the rib comprises:

a first rib layer formed of an inorganic insulating material and arranged on the insulating layer; and a second rib layer formed of an inorganic insulating material and arranged on the first rib layer, and the second rib layer protrudes from a side surface of the first rib layer and a side surface of the lower portion.

2. The display device of claim 1, wherein a thickness of the first rib layer is larger than a thickness of the lower electrode.

3. The display device of claim 2, wherein a thickness of the first rib layer is smaller than a total thickness of the lower electrode and the organic layer.

4. The display device of claim 1, wherein a width of the second rib layer is larger than a width of the upper portion.

5. The display device of claim 1, wherein a width of the second rib layer is smaller than a width of the upper portion.

6. The display device of claim 1, wherein the lower electrode has an end portion having a thickness reduced toward the first rib layer, and a part of the end portion is located in a gap formed between a part of the second rib layer, which protrudes from the side surface of the first rib layer, and the insulating layer.

7. The display device of claim 6, wherein the organic layer fills the gap.

8. The display device of claim 1, wherein the lower electrode is formed of silver, and the organic layer is in contact with an upper surface of the lower electrode.

9. The display device of claim 1, wherein a part of the lower electrode is located on the upper portion.

10. The display device of claim 1, wherein a part of the lower electrode is located on the second rib layer.

11. The display device of claim 1, further comprising:

a sealing layer continuously covering a display element which includes the lower electrode, the organic layer and the upper electrode, and the partition.

12. The display device of claim 11, further comprising:

an optical adjustment layer located between the upper electrode and the sealing layer and having a refractive index different from the upper electrode and the sealing layer.

13. A display device manufacturing method, comprising:

forming an insulating layer of an inorganic insulating material;

forming a first thin film of an inorganic insulating material on the insulating layer;

forming a second thin film of an inorganic insulating material on the first thin film;

forming a partition including a conductive lower portion arranged on the second thin film and an upper portion protruding from a side surface of the lower portion;

forming a second rib layer protruding from the side surface of the lower portion by patterning the second thin film;

forming a first rib layer having a width smaller than the second rib layer by removing a part of the first thin film, which is exposed from the second rib layer, and reducing a width of the first thin film;

forming a lower electrode on the insulating layer and the partition by vapor deposition;

forming an organic layer which emits light in response to application of a voltage, on the lower electrode, by vapor deposition; and forming an upper electrode which is in contact with the lower portion, on the organic layer, by vapor deposition.

14. The manufacturing method of claim 13, wherein formation of the lower electrode and the organic layer is continuously executed in a vacuum environment.

15. The manufacturing method of claim 13, further comprising:

forming a sealing layer continuously covering a display element which includes the lower electrode, the organic layer and the upper electrode, and the partition.

16. The manufacturing method of claim 15, wherein formation of the lower electrode, the organic layer, the upper electrode and the sealing layer is continuously executed in a vacuum environment.

\* \* \* \* \*